(12) United States Patent
Jin et al.

(10) Patent No.: US 10,451,908 B2
(45) Date of Patent: Oct. 22, 2019

(54) DISPLAY DEVICE

(71) Applicant: Japan Display Inc., Tokyo (JP)

(72) Inventors: Lu Jin, Tokyo (JP); Yosuke Hyodo, Tokyo (JP); Shinichiro Oka, Tokyo (JP)

(73) Assignee: Japan Display Inc., Tokyo (JP)

( * ) Notice: Subject to any disclaimer, the term of this patent is extended or adjusted under 35 U.S.C. 154(b) by 83 days.

(21) Appl. No.: 15/793,282

(22) Filed: Oct. 25, 2017

(65) Prior Publication Data

US 2018/0143482 A1 May 24, 2018

(30) Foreign Application Priority Data

Nov. 18, 2016 (JP) ................. 2016-224834

(51) Int. Cl.
| | |
|---|---|
| *G02F 1/1333* | (2006.01) |
| *G06F 3/14* | (2006.01) |
| *G06F 1/16* | (2006.01) |
| *G06F 3/044* | (2006.01) |
| *H01L 27/12* | (2006.01) |
| *G09G 3/30* | (2006.01) |
| *G06F 3/041* | (2006.01) |
| *G02F 1/1339* | (2006.01) |

(52) U.S. Cl.
CPC ...... *G02F 1/133308* (2013.01); *G02F 1/1339* (2013.01); *G02F 1/133305* (2013.01); *G06F 1/1643* (2013.01); *G06F 3/044* (2013.01); *G06F 3/0412* (2013.01); *G06F 3/1423* (2013.01); *G09G 3/30* (2013.01); *H01L 27/1218* (2013.01); *G02F 2001/133388* (2013.01); *G02F 2202/28* (2013.01)

(58) Field of Classification Search
CPC . G02F 1/0107; G02F 1/1339; G02F 1/133528
See application file for complete search history.

(56) References Cited

U.S. PATENT DOCUMENTS

| | | | |
|---|---|---|---|
| 6,266,121 B1 * | 7/2001 | Shigeta | ............... G02F 1/13394 349/123 |
| 2002/0027636 A1 * | 3/2002 | Yamada | ............ G02F 1/133305 349/155 |
| 2006/0066788 A1 | 3/2006 | Utsumi et al. | |

(Continued)

FOREIGN PATENT DOCUMENTS

| | | |
|---|---|---|
| JP | 2000-275626 A | 10/2000 |
| JP | 2006-091393 A | 4/2006 |

(Continued)

*Primary Examiner* — Dong Hui Liang

(74) *Attorney, Agent, or Firm* — Michael Best & Friedrich LLP

(57) ABSTRACT

A problem to be solved is, in a thin type display panel with few bezel sections, improving strength in a curved part or adhesion between substrates. A display panel includes a first substrate having flexibility, a second substrate having flexibility, a sealant for adhering the first substrate and the second substrate, and an adhesion section for adhering the first substrate and the second substrate arranged on the inner side or outer side of the sealant, wherein a curved part is arranged on the inner side of the sealant, and the adhesion section is arranged in the curved part or in the vicinity of the curved part.

11 Claims, 21 Drawing Sheets

(56) References Cited

U.S. PATENT DOCUMENTS

| | | | |
|---|---|---|---|
| 2007/0211202 A1* | 9/2007 | Ishii | G02F 1/1339 |
| | | | 349/153 |
| 2008/0088759 A1 | 4/2008 | Utsumi et al. | |
| 2011/0007042 A1 | 1/2011 | Miyaguchi | |
| 2012/0243207 A1* | 9/2012 | Wang | G09F 9/30 |
| | | | 362/97.1 |
| 2013/0050608 A1* | 2/2013 | Hu | G02F 1/133305 |
| | | | 349/58 |
| 2014/0065430 A1* | 3/2014 | Yamazaki | H01L 27/1214 |
| | | | 428/426 |
| 2015/0257289 A1* | 9/2015 | Lee | H05K 5/0017 |
| | | | 361/749 |
| 2016/0363795 A1* | 12/2016 | Jeon | G02F 1/1339 |

FOREIGN PATENT DOCUMENTS

| | | | |
|---|---|---|---|
| JP | 2008-089966 A | 4/2008 | |
| JP | 2014-206760 A | 10/2014 | |

* cited by examiner

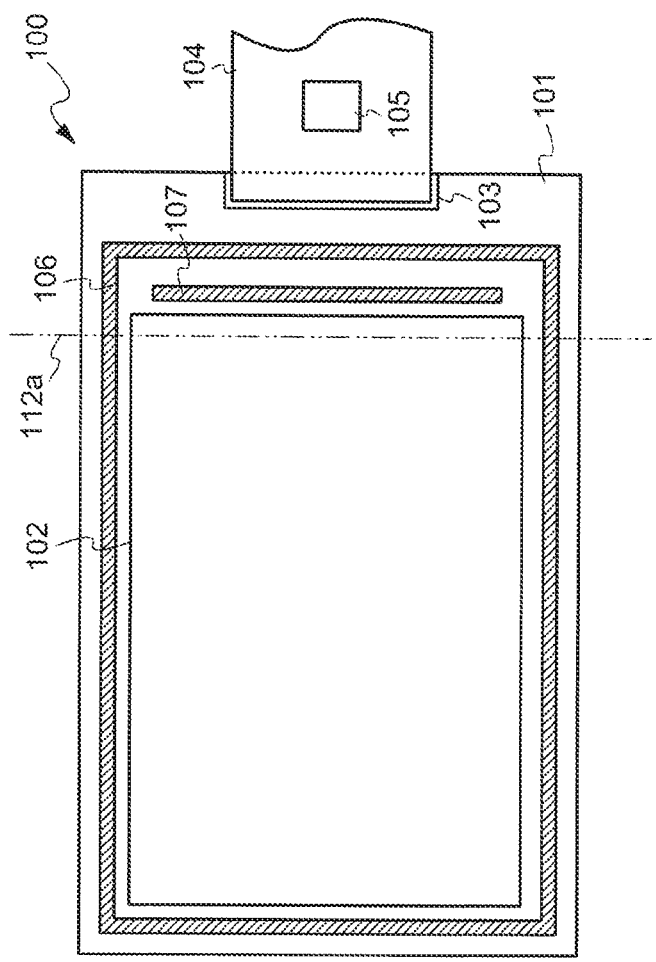

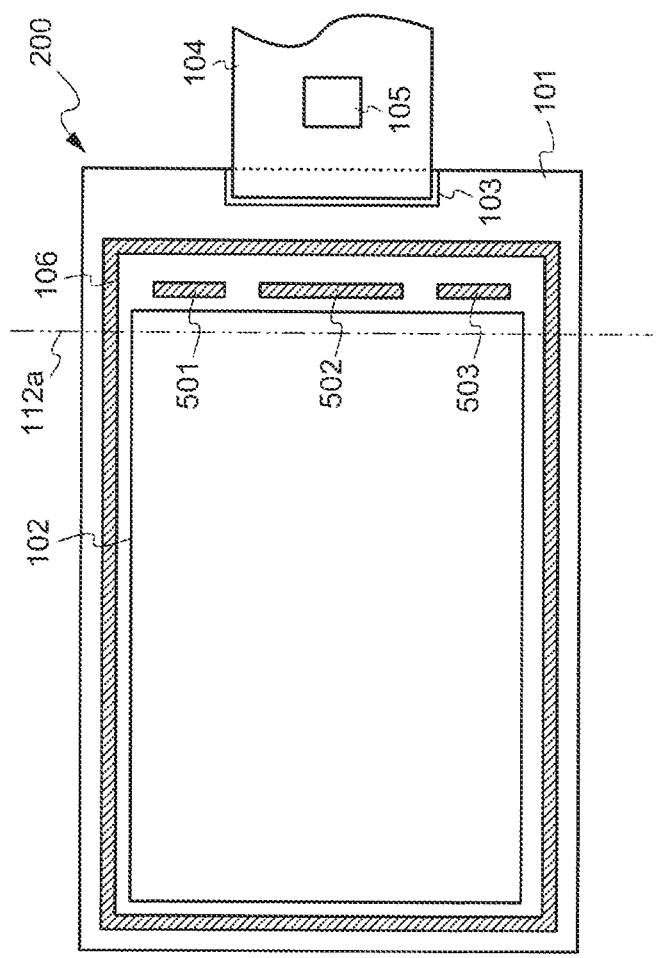

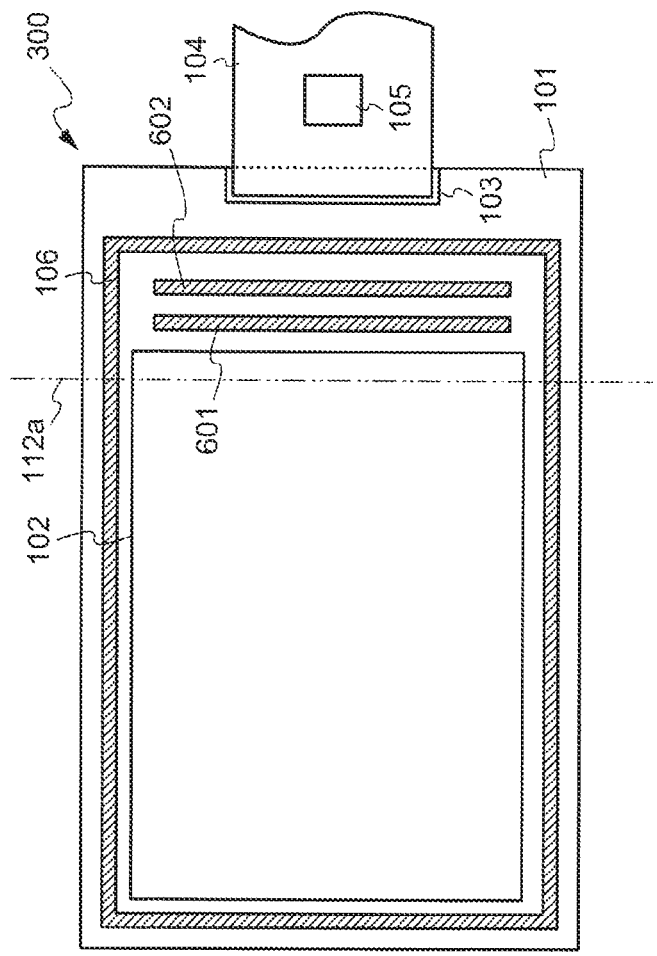

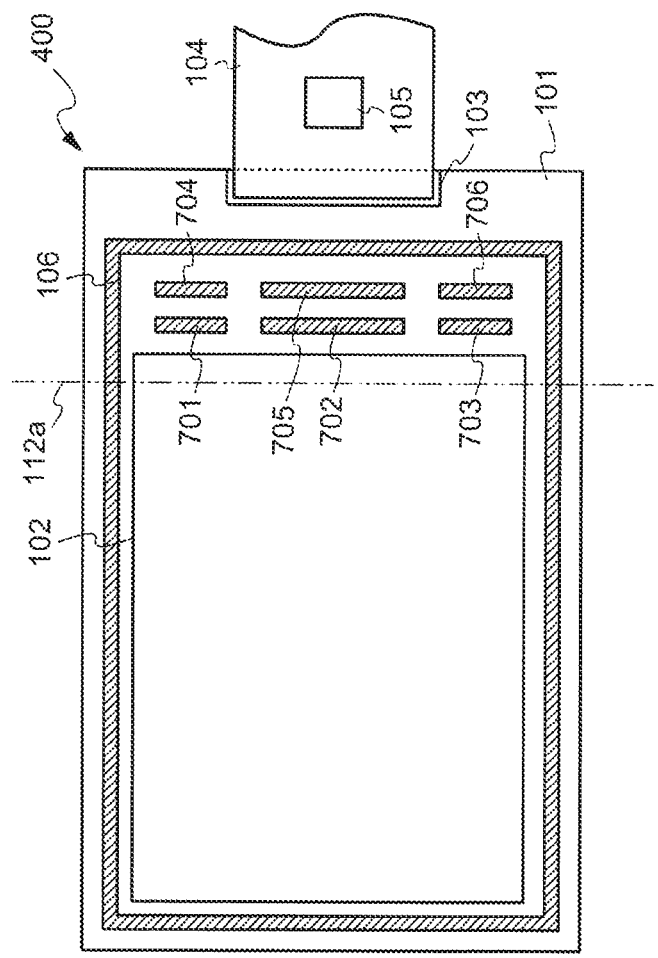

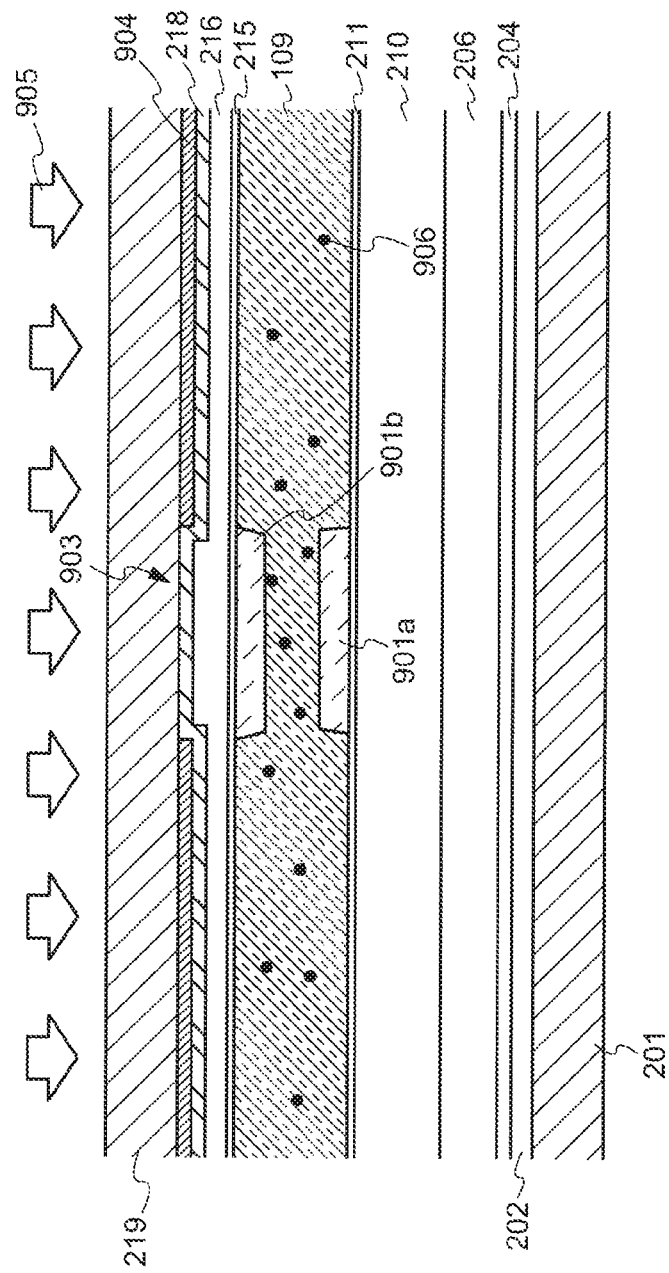

DISPLAY DEVICE

CROSS REFERENCE TO RELATED APPLICATIONS

This application is based on and claims the benefit of priority from the prior Japanese Patent Application No. 2016-224834, filed on Nov. 18, 2016, the entire contents of which are incorporated herein by reference.

FIELD

The present invention relates to display panels including a plurality of pixels. In particular, the present invention relates to a display panel using a flexible substrate as a support substrate.

BACKGROUND

Conventionally, a display panel using a substrate with flexibility (hereinafter referred to as a "flexible substrate") as a support substrate of a display device has been known. The display device using the flexible substrate has pliability as a whole and can be bent, and thus has a merit of great versatility for use environments.

Also, when the flexible substrate is used, a bezel portion (an edge portion other than a display screen) of the display device can be advantageously reduced. For example, Japanese Unexamined Patent Application Publication No. 2000-275626 discloses a display device having a sealant and an external input terminal provided at a bent portion of a flexible substrate. Japanese Unexamined Patent Application Publication No. 2014-206760 discloses a display device having a drive circuit part arranged on a back surface side of a display region by bending a substrate at a wiring portion connecting the display region and the drive circuit section.

SUMMARY

A display panel in one embodiment of the present invention includes a first substrate having flexibility, a second substrate having flexibility, a sealant for adhering the first substrate and the second substrate, and an adhesion section for adhering the first substrate and the second substrate arranged on the inner side or outer side of the sealant, wherein a curved part is arranged on the inner side of the sealant, and the adhesion section is arranged in the curved part or in the vicinity of the curved part.

BRIEF DESCRIPTION OF DRAWINGS

FIG. 4 is a plan view depicting an example of a schematic configuration of a display panel in the first embodiment;

FIG. 5 is a plan view depicting an example of a schematic configuration of a display panel in a second embodiment;

FIG. 6 is a plan view depicting an example of a schematic configuration of a display panel in a third embodiment;

FIG. 7 is a plan view depicting an example of a schematic configuration of a display panel in a forth embodiment;

FIG. 10A is a sectional view depicting the example of a manufacturing process of the display panel in the sixth embodiment;

DESCRIPTION OF EMBODIMENTS

Figure 1:
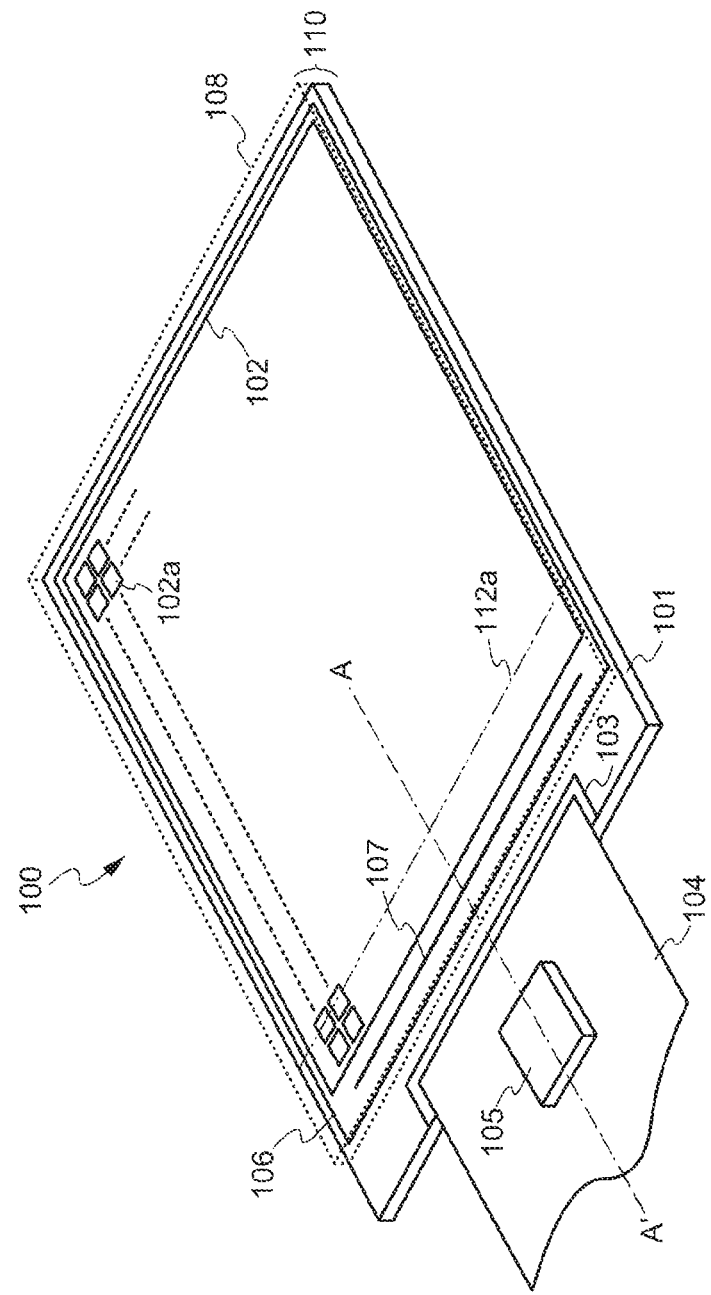
FIG. 1 is a perspective view depicting an example of a schematic configuration of a display panel in a first embodiment.

In the display panel described in Japanese Unexamined Patent Application Publication No. 2000-275626, the sealant and the external input terminal are required to be arranged at the bent portion, and thus the width of the bent part is required to be allocated enough for arrangement of the sealant and the external input terminal. Thus, there is a problem that the display panel cannot be made thin. Moreover, with the external input terminal arranged at the bent portion, there is a possibility that the external input terminal is broken at the time of bending.

In the display panel described in Japanese Unexamined Patent Application Publication No. 2014-206760, the substrate is bent between the display region and the drive circuit part, and thus a margin for bending is required to be allocated. Thus, there still is a room for improvement in reduction of the bezel portion of the display panel.

Thus, an object of the present invention is to increase the strength or the adhesion between the substrates at the bent portion in a thin display panel with a less bezel portion.

In the following, each embodiment of the present invention is described with reference to the drawings and so forth. However, the present invention can be implemented in various modes in a range not deviating from the gist of the invention, and should not be construed as being limited to the description of the embodiments illustrated below. Also, regarding the drawings, for more clarification of description, the width, thickness, shape, and so forth of each part or unit may be schematically represented, compared with actual modes. However, these schematic drawings are depicted by way of example and do not limit the interpretation of the present invention. Furthermore, in the specification and each drawing, a component including a function similar to that of a component in a drawing already described is provided with a reference character identical to that of the already-described component, and redundant description may be omitted.

Note in the specification and claims that expressions such as "above" and "below" for description of the drawings represent relative positional relations between a target structure and another structure. Specifically, when viewed from a side surface, a direction from a first substrate (array substrate) toward a second substrate (counter substrate) is defined as "above", and a direction opposite thereto is defined as "below".

Also, "inside" and "outside" represent relative positional relations of two areas with reference to a display section. That is, "inside" indicates a side relatively near the display section with respect to one area, and "outside" indicates a side relatively far from the display section with respect to one area. However, the definitions of "inside" and "outside" herein are assumed to be in a state in which the display panel is not bent.

Also in the specification, expressions such as "α includes A, B, or C", "α includes any of A, B, and C", and "α includes one selected from a group comprising A, B, and C" do not preclude a case in which a includes a plurality of combinations of A to C unless otherwise specified. Furthermore, these expressions do not preclude a case in which a includes another component.

A "display panel" refers to a structure which displays video using an electrooptic layer. For example, the term "display panel" may indicate a display cell including an electrooptic layer or may indicate a structure having another optical member (for example, a polarizing member, backlight, cover member, touch panel, or the like) attached to a display cell. Here, the "electrooptic layer" can include a liquid-crystal layer, electroluminescence (EL) layer, electrochromic (EC) layer, or electrophoretic layer unless a technical contradiction arises. Therefore, while a liquid-crystal display panel including a liquid-crystal layer is illustrated and described as a display panel in the embodiments described below, this is not meant to preclude application to a display panel including any of the other electrooptic layers described above.

First Embodiment

<Structure of Display Device>

First, a schematic configuration of a liquid-crystal display panel as an example of a display panel 100 of a first embodiment is described. FIG. 1 is a perspective view of a schematic configuration of the display device 100 in the first embodiment.

The display panel 100 has an array substrate 101, a display section 102, a terminal section 103, a flexible printed circuit board 104, a drive circuit 105, a sealant 106, adhesive section 107 and a counter substrate 108. For simplification of description, optical members such as a polarizing member and a backlight are omitted in FIG. 1. These optical members will be described further below.

The array substrate 101 is a substrate having a thin-film transistor and a plurality of pixels 102a including pixel electrodes connected to the thin-film transistor provided on a substrate with flexibility (for example, a resin substrate). The display section 102 is a region configured with the plurality of pixels 102a arrayed in a row direction and a column direction.

Each pixel 102a includes a circuit using a thin-film transistor as a switching element. By controlling ON/OFF operation of the switching element in response to a supplied video signal, each pixel 102a performs orientation control over liquid-crystal molecules corresponding to a pixel electrode included in the pixel 102a. That is, the above-described display section 102 refers to a region including the thin-film transistor and a pixel to which a video signal is supplied via the thin-film transistor (the pixel may be hereinafter referred to as a "first pixel").

Figure 2:
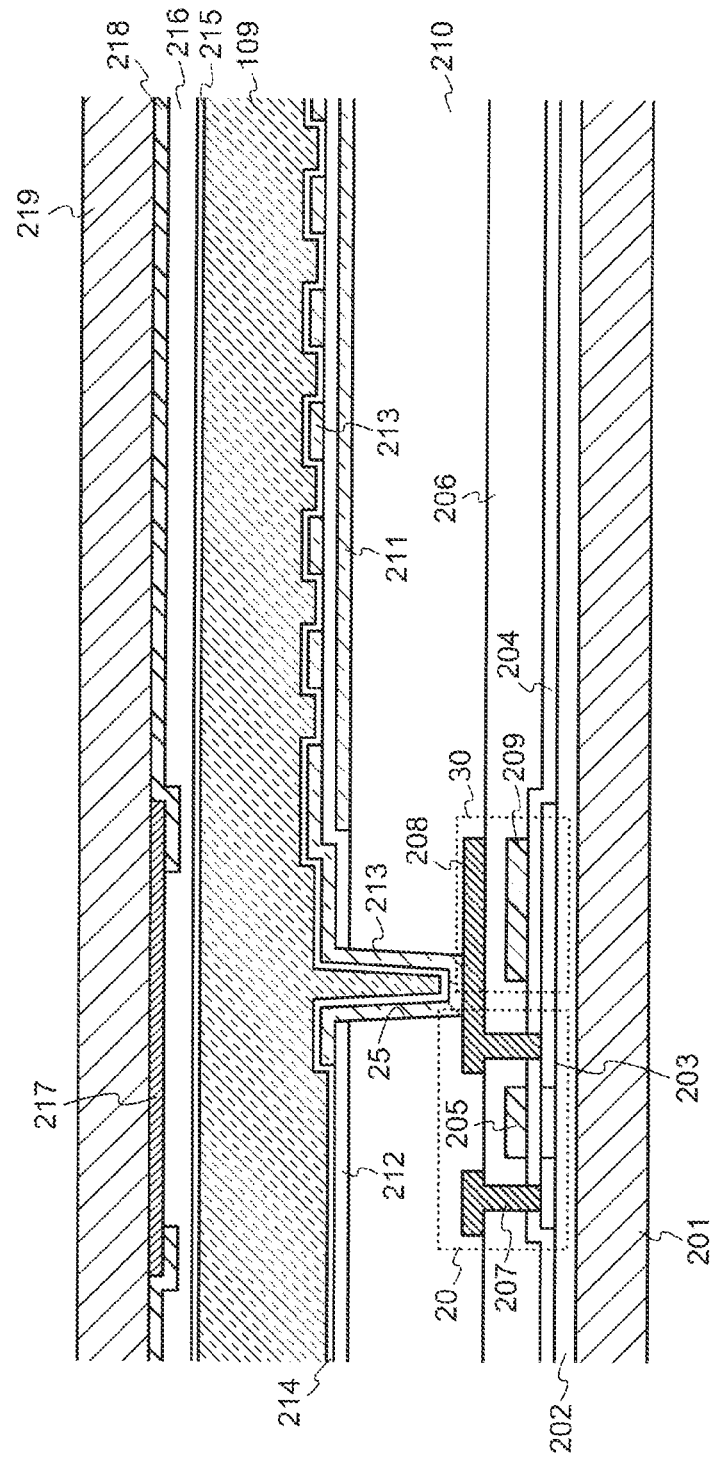
FIG. 2 is a sectional view depicting an example of the configuration of a pixel structure of the display panel in the first embodiment.

Here, the pixel 102a as a first pixel is briefly described. FIG. 2 is a sectional view depicting the configuration of a pixel structure of the display device 100 in the first embodiment.

In FIG. 2, on a front surface of the resin substrate configured of a resin material such as polyimide, an undercoat layer 202 configured of an inorganic insulating material is provided. Above the undercoat layer 202, a thin-film transistor 20 and a retention capacitor 30 are provided.

The thin-film transistor 20 includes a semiconductor layer 203, a gate insulating layer 204, a gate electrode 205, an insulating layer 206, a source electrode 207, and a drain electrode 208. These components can be configured of known materials.

The retention capacitor 30 includes the semiconductor layer 203, the gate insulating layer 204, a capacitive electrode 209, the insulating layer 206, and the drain electrode 208. Here, the semiconductor layer 203, the gate insulating layer 204, and the capacitive electrode 209 configure a first retention capacitor, and the capacitive electrode 209, the insulating layer 206, and the drain electrode 208 configure a second retention capacitor. The retention capacitor 30 has a total capacitance of these first retention capacitor and second retention capacitor.

Above the thin-film transistor 20 and the retention capacitor 30, a resin layer 210 configured of a resin material such as acrylic is provided, planarizing undulations due to the thin-film transistor 20 and the retention capacitor 30. Above the resin layer 210, a common electrode 211 configured of a transparent conductive film made of ITO (Indium Tin Oxide) or the like is provided. Above the common electrode 211, a pixel electrode 213 is provided via an insulating layer 212.

As the insulating layer 212, an inorganic insulating film such as, for example, a silicon oxide film or silicon nitride film can be used, although not limited thereto. Also, as with the common electrode 211, the pixel electrode 213 is configured of a transparent conductive film made of ITO or the like. The pixel electrode 213 is electrically connected to the drain electrode 208 via a contact hole 25 provided in the resin layer 210 and the insulating layer 212. While it seems that a plurality of pixel electrodes 213 are provided in FIG. 2, the pixel electrode 213 in a planar view has, in practice, a comb-like pattern shape. That is, the pixel electrode 213 in the planar view has a shape with a plurality of adjacently-arranged linear electrodes connected at one end.

In the present embodiment, an electric field (horizontal electric field) is formed between the common electrode 211 and the pixel electrode 213. A display device using a horizontal electric field as described above is referred to as a display device in IPS (In-Plain Switching) mode. Also in the IPS mode, as in the present embodiment, a mode using a horizontal electric field when the common electrode 211 and the pixel electrode 213 are arranged so as to overlap (in this case, the horizontal electric field is referred to as a fringe electric field) is referred to as FFS (Fringe Field Switching) mode.

However, any other liquid-crystal display mode may be used. For example, a mode using a horizontal electric field formed by using a pixel electrode and a common electrode provided in the same layer may be used. Also, VA (Vertical Alignment) mode may be used, in which a vertical electric field is formed between a pixel electrode provided on an array substrate side and a common electrode provided on a counter electrode side to control liquid-crystal orientation in that vertical electric field.

Above the pixel electrode 213, an alignment film 214 is provided. In the present embodiment, components from the resin substrate 201 to the alignment film 214 are collectively referred to as the array substrate 101. To the pixel electrode 213, a video signal is supplied via the thin-film transistor 20. The video signal is supplied to the source electrode 207 of the thin-film transistor 20, and is transmitted to the drain electrode 208 by the control of the gate electrode 205. As a result, the video signal is supplied from the drain electrode 208 to the pixel electrode 213.

Above the alignment film 214, a liquid-crystal layer 109 is retained. As described above, the liquid-crystal layer 109 is retained by being surrounded by a sealant 106 between the array substrate 101 and the counter substrate 108.

Above the liquid-crystal layer 109 an alignment film 215 on a counter substrate 108 side is provided. Above the alignment film 215, an overcoat layer 216 is provided. The overcoat layer 216 planarizes undulations due to a light-shielding member 217 configured of a resin material containing a black pigment or black metal material and a color filter member 218 configured of a resin material containing a pigment or dye corresponding to each color of RGB.

Above the light-shielding member 217 and the color filter member 218, a resin substrate 219 configured of a resin material such as polyimide is arranged. In practice, the light-shielding member 217, the color filter member 218, the overcoat layer 216, and the alignment film 215 are laminated above one surface of the resin substrate 219 to configure the counter substrate 108. When the moisture permeability of the resin substrate 219 is high, for improvement in resistance to water, an inorganic insulating film made of silicon nitride, silicon oxide, or the like may be formed between the resin substrate 219 and the color filter member 218.

As described above, the display section 102 of the present embodiment has the plurality of pixels 102a having the structure described by using FIG. 2.

With reference to FIG. 1 again, the terminal section 103 is a terminal which supplies an external video signal or the like to the display section 102. Specifically, the terminal section 103 is configured with wirings connected to the respective pixels 102a integrated together.

The flexible printed circuit board 104 is electrically connected to the terminal section 103 to supply an external video signal, drive signal, and so forth. The flexible printed circuit board 104 is configured with a plurality of wirings arranged on a resin film, and is bonded to the terminal section 103 via an anisotropic conductive film or the like. The flexible printed circuit board 104 is provided with the drive circuit 105 configured of an IC chip.

The drive circuit 105 supplies the display section 102 with a video signal to be supplied to the pixel electrode of each pixel 102a and a drive signal for controlling the thin-film transistor of each pixel 102a. In FIG. 1, an example is depicted in which the drive circuit 105 configured of an IC chip for controlling the thin-film transistor configuring each pixel 102a is provided to the flexible printed circuit board 104. However, a drive circuit such as a gate driver circuit or a source driver circuit can be provided around the display section 102 by using a thin-film transistor. Also, the drive circuit 105 configured of an IC chip can be provided on the array substrate 101 outside the sealant 106 in COG (Chip On Glass) mode.

The sealant 106 bonds the array substrate 101 and the counter substrate 108 together, and retains the liquid-crystal layer 109 (refer to FIG. 2) between the array substrate 101 and the counter substrate 108. For simplification of the drawing, the counter substrate 108 is indicated by dotted lines in FIG. 1. Also, although not depicted in FIG. 1, the counter substrate 108 includes a light-shielding member and a color filter member. A structure including the array substrate 101, the sealant 106, the counter substrate 108, and the liquid-crystal layer 109 is hereinafter referred to as a liquid-crystal cell 110.

The sealant 106 is a resin member arranged in a rectangular shape so as to surround the liquid crystal layer 109. The sealant 106 serves as a dam for preventing the inner side liquid crystal layer 109 from flowing to the outer side and plays the role of preventing moisture and oxygen from entering from the outside.

On the other hand, the adhesive section 107 is a member arranged separately from the sealant 106 on the inner side of the sealant 106. Specifically, the adhesive section 107 is a resin member arranged in a straight line along the sealant 106. When the liquid crystal cell 110 is bent, the adhesive section 107 plays the role of securing a cell gap of the bent part and preventing misalignment between the array substrate 101 and the opposing substrate 108. This point is described later.

In FIG. 1, a two-dot-chain line 112a depicted inside the sealant 106 indicates a position where the display panel 100 is bent (a position where the bending of the display panel 100 starts), as will be described further below. In this manner, the bending position of the liquid-crystal cell 110 indicated by the two-dot-chain line 112a is inside the sealant 106. The reason why the bending position is set inside the display section 102 in the present embodiment will be described further below.

Figure 3:
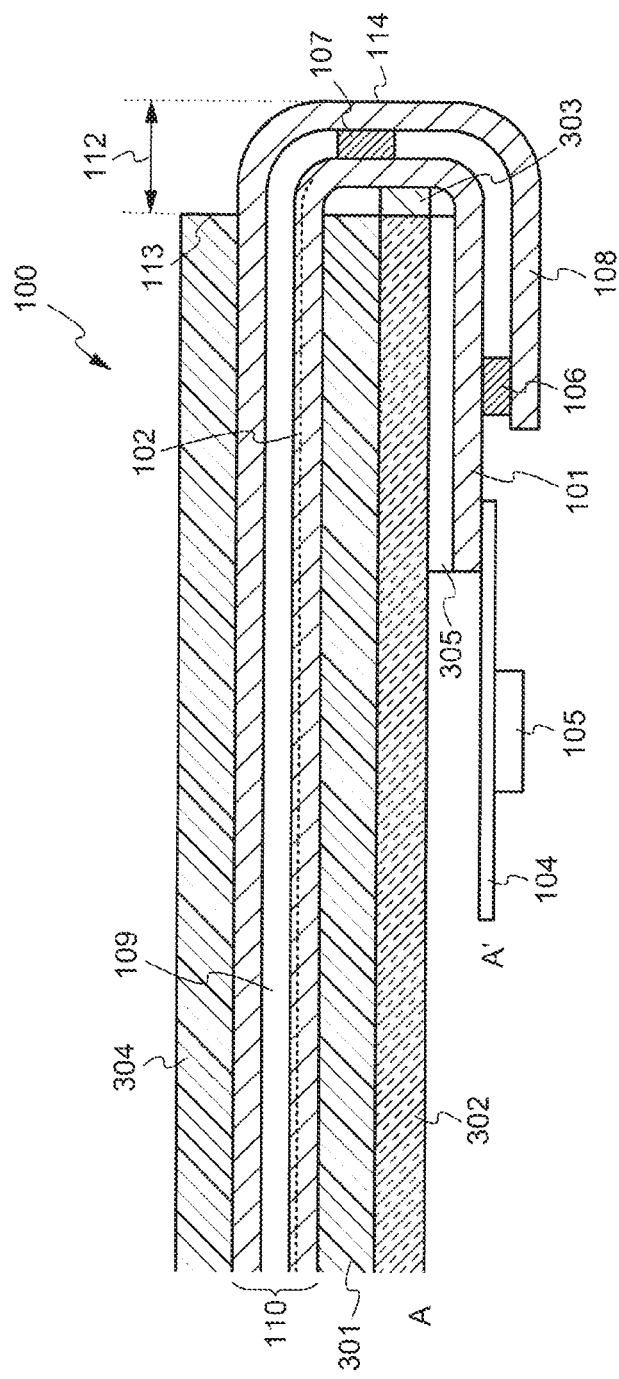
FIG. 3 is a sectional view depicting the example of the schematic configuration of the display panel in the first embodiment.

FIG. 3 is a diagram depicting a sectional configuration of the display panel 100 of the first embodiment. Specifically, FIG. 3 depicts a state of the display panel 100 depicted in FIG. 1 as being cut along a one-dot-chain line A-A' and partially bent. FIG. 4 is a plan view of a schematic configuration of the display device 100 in the first embodiment.

In FIG. 3, of two surfaces of the array substrate 101, a surface opposing (facing) the counter substrate 108 is defined as a front surface, and a surface opposite to the front surface is defined as a back surface. Similarly, of two surfaces of the counter substrate 108, a surface opposing (facing) the array substrate 101 is defined as a front surface, and a surface opposite to the front surface is defined as a back surface. Therefore, the liquid-crystal layer 109 is retained as interposed between the front surface of the array substrate 101 and the front surface of the counter substrate 108 inside the sealant 106.

In the display panel 100 of the present embodiment, a polarizing member 301, a light-guiding member 302, and a light source 303 are arranged on the back surface side of the array substrate 101 so as to be overlapped on the display section 102. Here, the polarizing member 301 and the light-guiding member 302 are configured as interposed on the back surface side of the array substrate 101. Specifically, the polarizing member 301 and the light-guiding member 302 are interposed between a portion of the back surface of the array substrate 101 inside a curved part 112, which will be described further below, and a portion thereof outside the curved part 112. Also, the light source 303 is arranged on a side surface of the light-guiding member 302 so as to oppose the curved part 112, which will be described further below. As the light source 303, for example, an LED light source can be used. These light-guiding member 302 and light source 303 configure an illuminating device (backlight).

On the back surface side of the counter substrate 108, the polarizing member 304 is arranged. With this, light emitted from the light source 303 is guided by the light-guiding member 302 to the polarizing member 301, and is recognized by an observer via the liquid-crystal cell 110 and the polarizing member 304. In the specification and claims, an optically acting member such as a polarizing member, a light-guiding member, or a light source may be referred to as an "optical member".

Here, the example is described in which a polarizing member and an illuminating device are provided as members other than the liquid-crystal cell 110. In another example, another optical member (such as a retardation plate or antireflection plate) or a touch panel may further be provided. For these optical member and touch panel, a known member or a known structure can be used.

Meanwhile, in the display panel 100 of the present embodiment, a substrate with flexibility (for example, a resin substrate) is used as a support substrate of the array substrate 101. Thus, the array substrate 101 has flexibility as a whole. Similarly, a substrate with flexibility is used as a support substrate of the counter substrate 108, and thus the counter substrate 108 also has flexibility as a whole. Therefore, the display panel 100 of the present embodiment can be bent so that the flexible printed circuit board 104 is arranged on the back surface side of the liquid-crystal cell 110, as depicted in FIG. 3.

In the display panel 100 of the present embodiment, a portion bent as being folded is referred to as a "curved part". The display panel 100 has the curved part 112 inside the sealant 106. Also in a planar view, the display panel 100 is bent so that the portion of the back surface of the array substrate 101 inside the curved part 112 and the portion thereof outside the curved part 112 are overlapped each other. Here, since the liquid-crystal cell 110 is bent along the two-dot-chain line 112a depicted in FIG. 1, the sealant 106 is partially positioned on the back surface side of the display device 100. That is, in the display panel 100, the sealant 106 partially opposes the back surface of the array substrate 101.

As described above, since the display panel 100 of the present embodiment has a structure in which the bent part 112 is included on the inner side of the sealant 106, it is preferable to pay attention to variation in the cell gap in the bent part 112 and misalignment between the array substrate 101 and the opposing substrate 108. This is because such variation in the cell gap and misalignment between substrates also affects the display section 102 in the vicinity of the bent part 112.

For example, in the bent part 112, since a force acts in a direction in which the liquid crystal layer 109 is crushed, the cell gap tends to fluctuate. As is described later, since a column shaped spacer formed from a resin material is arranged in the display panel 100 of the present embodiment, it is possible to arrange the spacer as designed even in the bent part 112. However, in the bent part 112, since a relatively large force different from normal is at work, the cell gap sometimes fluctuates even when the spacer is arranged. Such cell gap fluctuation can cause display unevenness in the vicinity of the bent part 112.

In addition, in the bent part 112, since the curvature of a folded section is different between the array substrate 101 and the opposing substrate 108, misalignment easily occurs in the direction along the substrate surface. Such misalignment between substrates becomes misalignment between the pixel 102a and the light shielding member 217 in the display section 102, and as a result, an aperture ratio of the pixel 102a may decrease.

A column shaped spacer formed by the resin material described above is generally arranged on the opposing substrate 108. Specifically, a resin material is coated on the opposing substrate 108 and formed by patterning by photolithography. Therefore, although the column shaped spacer formed by a resin material is in contact with the array substrate 101 it is not adhered. As a result, when a force acts in a direction along the substrate surface at the bent part 112, the array substrate 101 moves regardless of the presence or absence of a spacer, thereby it is difficult to handle misalignment between the substrates described above.

Therefore, in the present embodiment, separate from the spacer described above, the adhesive section 107 formed from a resin material is arranged in the bent part 112 or the vicinity of the bent part 112 on the inner side of the sealant. Specifically, as shown in FIG. 1, FIG. 3 and FIG. 4, the adhesive section 107 extends to the curved part 112 along a direction in which the curved axis extends (along a two-dot chain line 112a which is a folding position of the bending section 112). In other words, it can be said that the adhesion section 107 is arranged in a straight line along a section of the sealant 106 adjacent to the terminal section 103 or along an edge on the terminal section 103 side among each edge of the display section 102.

In particular, in the present embodiment, as is shown in FIG. 4, the adhesive section 107 is arranged between the display section 102 and the sealant 106 at the bent part 112. However, the position where the adhesion section 107 is arranged is arbitrary, and may be arranged anywhere as long as it is in the vicinity of the bending section 112 (including the interior of the bent part 112). In addition, in the present embodiment, although an example is shown in which the adhesive section 107 is arranged along the extending direction of the bending axis, it is also possible to arrange the adhesive section 107 perpendicular to a longitudinal direction or diagonally.

Furthermore, as is shown in FIG. 4, the length of the adhesive section 107 in the extending direction of the bending axis is shorter than the length of the sealant 106 in the extending direction of the bending axis. That is, an end section of the adhesive section 107 is not in contact with the sealant 106. The reason for adopting this structure is to prevent spreading of a liquid crystal material by the adhesive section 107 when the liquid crystal material is dripped by the ODF (One Drop Fill) method described above.

It is possible to use a member formed from a resin material as the adhesive section 107 explained above. Although the same material as the sealant 106 can be used as the resin material, a material different from that of the sealant 106 may also be used. Since the adhesive section 107 is arranged on the inner side the sealant 106, it does not have to play the role of not allowing moisture and oxygen to pass through like the sealant 106. As a result, it is possible to use a resin material having higher moisture permeability or oxygen permeability than the resin material used for the sealant 106. That is, the number of options of the resin material that can be used as the adhesive section 107 is larger than that of the resin material that can be used as the sealant 106.

In addition, in the case when polyimide is used as the resin substrate 201 and the resin substrate 219 shown in FIG. 2, there is a problem that transmittance with respect to ultraviolet light is low. With regards to the sealant 106, although it is possible for ultraviolet light to be irradiated from a horizontal direction of the liquid crystal cell 110 to cure the sealant 106, ultraviolet light is blocked by the adhesive section 107, the sealant 106, the resin substrate 201 and the resin substrate 219. Therefore, it is preferred to use a resin material having a thermosetting property as the adhesive section 107 of the present embodiment. In particular, a resin material having both photocurability and thermosetting properties is preferred.

For example, there is an epoxy skeleton as a representative skeleton having a thermosetting property, and a (meth) acryl skeleton as a representative skeleton having photocurability. Since a resin material having these skeletons is not only cured by ultraviolet light irradiation but also cured by applying heat, it is suitable as a resin material for forming the adhesive section 107 of the present embodiment. Naturally, it is not essential to have a thermosetting property, and a photocurable resin material may also be used.

As described above, according to the present embodiment, it is possible to improve the strength of the bending section 112 by arranging the adhesive section 107 in the bending section 112. In addition, unlike the column shaped spacer formed from the resin material described above, the adhesive section 107 has a feature of adhering the array substrate 101 and the opposing substrate 108. As a result, according to the present embodiment, since the array substrate 101 and the opposing substrate 108 are adhered together by the adhesive section 107 also in the bent part 112, it is possible to improve adhesion between the substrates.

Furthermore, a filler may be contained in the adhesive section 107. Since this makes it possible to reinforce the adhesive section 107 and make it difficult to be deformed, securing a cell gap in the bent part 112 becomes more appropriate. In addition, although an example is shown in the present embodiment in which a linear adhesive section 107 is arranged, the shape is arbitrary and may also be a plane shaped adhesive section.

With reference to FIG. 1 again, in the present embodiment, an insulating layer 305 is provided as a cushioning member in order to avoid a contact between the back surface of the array substrate 101 and the light-guiding member 302. As the insulating layer 305, for example, a resin layer can be used. As a matter of course, the insulating layer 305 can be omitted. Also, when the drive circuit 105 is provided on the array substrate 101 in COG mode, the configuration may be such that the drive circuit 105 is covered with the insulating layer 305 for protection.

Also in the present embodiment, the configuration is such that a portion of the liquid-crystal cell 110 not overlapped on the polarizing member 301 and the polarizing member 304 is bent. Thus, as depicted in FIG. 3, the curved part 112 in the display panel 100 of the present embodiment slightly projects from an edge 113 of the polarizing member 304 in a planar view. Here, in a planar view, an end of the curved part 112 visually recognizable by the observer is defined as a "virtual end". That is, the curved part 112 can also be said as indicating a portion positioned in a range from the edge 113 of the polarizing member 304 to a virtual end 114.

In the present embodiment, as the polarizing member 301 and the polarizing member 304, a member harder than the substrates with flexibility configuring the array substrate 101 and the counter substrate 108 is used. Thus, the polarizing member 301 and the polarizing member 304 cannot be bent so as to be folded, and an end of the optical member (for example, the edge 113 of the polarizing member 304) is inside the curved part 112.

The display panel 100 of the present embodiment thus has a structure in which flexural rigidity of the curved part 112 is lower than flexural rigidity of a portion inside the curved part 112 (that is, a portion where the polarizing member 301 and the polarizing member 304 are arranged). Here, "flexural rigidity" refers to a degree of difficulty in dimensional change (deformation) with respect to a bending force.

Meanwhile, in the display panel 100 depicted in FIG. 3, a region where the observer can visually recognize video (a displayable region) can be substantially regarded as a region where the polarizing member 304 is arranged. Therefore, by fully utilizing the region where the polarizing member 304 is arranged, the displayable region can be increased to maximum.

Thus, as depicted in FIG. 3, in the display panel 100 of the present embodiment, the display section 102 is provided not only in the region overlapped on the polarizing member 304 but also so as to be extended to the curved part 112. This allows the polarizing member 304 and the display section 102 to be appropriately overlapped to be extended to the edge 113 even if a laminating position of the polarizing member 301 and the polarizing member 304 is shifted or the bending position of the liquid-crystal cell 110 is shifted.

In the present embodiment, the display section 102 is provided midway through the curved part 112, and is not provided thereafter. That is, the above-described first pixel is not provided to a part of the curved part 112 or a portion inside the sealant 106 and outside the curved part 112. This is because the curved part 112 in the display panel 100 of the present embodiment is basically not a displayable region.

However, the light-shielding member 217 or the color filter member 218 depicted in FIG. 2 may be overlapped not only on the display section 102 but also on the display section 102 and the curved part 112. This is because the light-shielding member 217 or the color filter member 218 provided to the curved part 112 can have a role of reinforcing the curved part 112.

In addition, as described above, in the display panel 100 of the present embodiment, not a spherical spacer but a columnar spacer configured of a resin material is used. In the present embodiment, a spacer is arranged also to the curved part 112 to maintain a cell gap of the curved part 112. Here, it is difficult for a spherical spacer to control the position of the spacer, and the position of the spacer in the curved part 112 may be fluctuated. By contrast, a columnar spacer is formed on the array substrate 101 by using photolithography, and thus can be advantageously arranged appropriately at a position as designed.

As described above, in the configuration of the display panel 100 of the present embodiment, the liquid-crystal cell 110 is bent along a portion inside the sealant 106, thereby allowing full and effective utilization to the end (edge) of the display panel 100 as a displayable region. Also, a substrate with flexibility is used as a support substrate, thereby allowing the liquid-crystal cell 110 to be bent so as to be folded.

Next, in the display panel 100 of the present embodiment, an adhesive section 107 for adhering the array substrate 101 and the opposing substrate 108 is arranged in the vicinity of the bent part 112. In this way, it is possible to prevent cell gap fluctuation in the vicinity of the bent part 112 due to bending of the liquid crystal cell 110 and misalignment between the substrates.

Therefore, according to the present embodiment, it is possible to provide a thin display panel with few bezel sections. In addition, in such a display panel, it is possible to increase the strength or adhesion at the bent part (or the vicinity of the bent part).

Furthermore, although an example is shown in the present embodiment in which the adhesive section 107 is arranged inside the bent part 112 as the vicinity of the bent part 112 on the inner side of the sealant, the present invention is not limited to this structure. For example, a structure is possible in which the adhesive section 107 is arranged further to the inner side (that is, further to the inner side of the bent part 112) than the two-dot chain line 112*a* in FIG. 4.

Second Embodiment

In the second embodiment, a display panel 200 in which a plurality of adhesive sections are arranged on the inner side of the sealant 106 is explained. Specifically, an example is shown in which a plurality of adhesive sections are arranged along the extending direction of the bending axis of the bent part (the direction along the extending direction of the two-dot chain line 112*a*). Furthermore, in the present embodiment, explanation is provided focusing on the difference in structure with the display panel 100 of the first embodiment, and the same reference numerals are attached to the same structures and an explanation thereof may be omitted.

FIG. 5 is a planar view diagram showing an example of a schematic structure of the display panel 200 in the second embodiment. The display panel 200 of the present embodiment shown in FIG. 5 has a plurality of adhesive sections 501 to 503 along the extending direction of the bending axis. That is, compared with the display panel 100 of the first embodiment, the adhesive section 107 shown in FIG. 4 is divided into three sections.

In the present embodiment, similar to the first embodiment, the ODF method is adopted when a liquid crystal material is sealed on the inner side of the sealant 106. In this case, the liquid crystal material dripped from above the array substrate 101 spreads in a ring shape so that the inner side of the sealant 106 is filled with the liquid crystal material. At this time, in the present embodiment, since there is a gap between adjacent adhesive sections 501 to 503, there is an advantage that the liquid crystal material easily enters between the adhesive sections 501 to 503 and the sealant 106.

Furthermore, although an example is shown in the present embodiment in which three adhesive sections are arranged with respect to the bent part 112, the present invention is not limited to this structure and a plurality of adhesive sections may be further arranged in series. In addition, reversely, two adhesive sections may also be arranged in series.

As described above, according to the present embodiment, in addition to the effects of the first embodiment described above, when the liquid crystal material is dripped onto the array substrate 101, the effect of easily spreading the liquid crystal material on the array substrate 101 can be exhibited.

Third Embodiment

In the third embodiment, a display panel 300 is explained in which a plurality of adhesive sections are arranged on the inner side of the sealant 106. Specifically, an example is shown in which a plurality of adhesive sections are arranged in a direction intersecting the extending direction of the bending axis. Furthermore, in the present embodiment, explanation is provided focusing on the difference in structure with the display panel 100 of the first embodiment, and the same reference numerals are attached to the same structures and an explanation thereof may be omitted.

FIG. 6 is a planar view diagram showing an example of a schematic structure of the display panel 300 according to the third embodiment. The display panel 300 of the present embodiment shown in FIG. 3 includes a plurality of adhesive sections 601 and 602 in a direction intersecting the extending direction of the bending axis. That is, compared to the display panel 100 of the first embodiment, two adhesive sections 107 shown in FIG. 4 are arranged in a direction intersecting the extending direction of the bending axis.

In the case of the structure of the present embodiment, it is possible to improve the strength at the bent part 112 and adhesion between the substrates by increasing the number of adhesive sections.

Furthermore, although an example is shown in the present embodiment in which two adhesive sections are arranged at the bent part 112, the present invention is not limited to this structure and a plurality of adhesive sections may further be arranged in a direction intersecting the extending direction of the bending axis. In this case, it is possible to adjust the distance between adjacent adhesive sections by suitably adjusting the width of the adhesive section.

As described above, according to the present embodiment, it is possible to further increase the effects of the first embodiment described above and increase strength and adhesion at the bent part.

Fourth Embodiment

In the fourth embodiment, a display panel 400 is explained in which a plurality of adhesive sections are arranged on the inner side of the sealant 106. Specifically, an example is shown in which a plurality of adhesive sections are arranged along the extending direction of the bending axis and are also arranged along a direction intersecting the extending direction. Furthermore, in the present embodiment, explanation is provided focusing on the difference in structure with the display panel 100 of the first embodiment, and the same reference numerals are attached to the same structures and an explanation thereof may be omitted.

FIG. 7 is a planar view diagram showing an example of a schematic structure of the display panel 400 according to the fourth embodiment. The display panel 400 of the present embodiment shown in FIG. 7 has a plurality of adhesive sections 701 to 706 arranged along the extending direction of the bending axis and also arranged along a direction intersecting the extending direction. That is, the display panel 100 according to the present embodiment is a combination of the structures of the adhesive sections in the second embodiment and the third embodiment.

In the case of the structure of the present embodiment, by dividing the adhesive section in the extending direction of the bending axis, similar to the second embodiment, the advantage that the liquid crystal material easily enters between the adhesive sections 701 to 706 and the sealant 106 can be obtained. In addition, by arranging the adhesive section in a direction intersecting the extending direction of the bending axis, strength and adhesion at the bending section can be further increased the same as in the third embodiment.

Furthermore, although an example is shown in the present embodiment in which six adhesive sections are arranged at the bent part 112, the present invention is not limited to this structure and a plurality of adhesive sections may be further arranged in the extending direction of the bending axis and a direction intersecting the extending direction. In addition, reversely the number of adhesive sections may be reduced to four.

As described above, according to the present embodiment, in addition to the effects of the first embodiment described above, when the liquid crystal material is dripped onto the array substrate 101, the effect of the liquid crystal material easily spreading on the array substrate 101 can be obtained. In addition, compared with the first embodiment, strength and adhesion at the bent part can be further increased.

Fifth Embodiment

In the fifth embodiment, an example is explained in which the position at which the adhesion section 107 is arranged is different from that in the first embodiment. Furthermore, in the present embodiment, explanation is provided focusing on the difference in structure with the display panel 100 of the first embodiment, and the same reference numerals are attached to the same structures and an explanation thereof may be omitted.

Figure 8A:
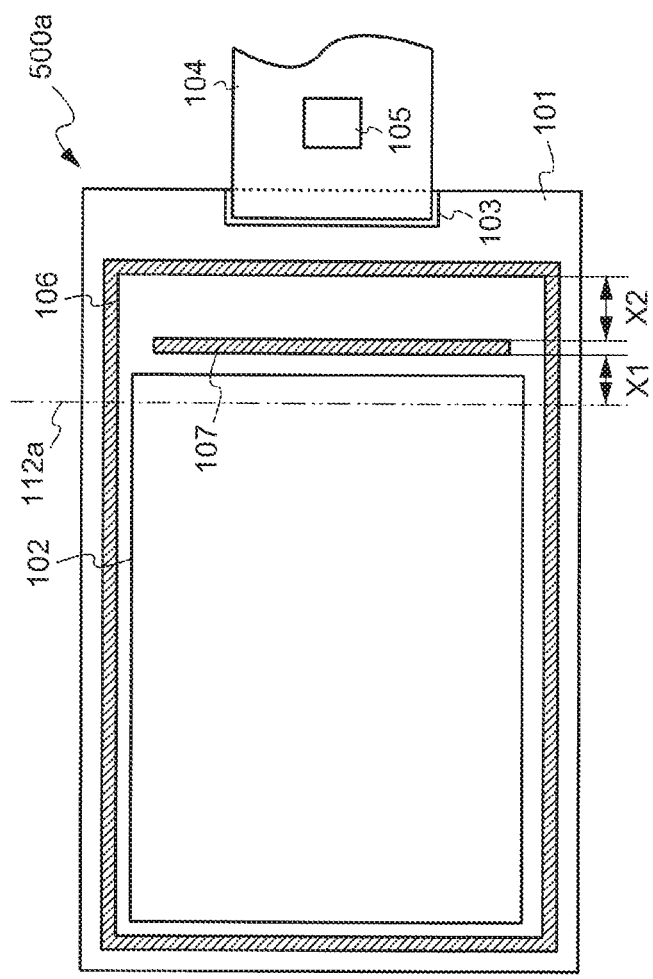
FIG. 8A is a plan view depicting an example of a schematic configuration of a display panel in a fifth embodiment.

FIG. 8A is a planar view diagram showing an example of a schematic structure of the display panel 500a in the fifth embodiment. Similar to the first embodiment, the display panel 500a of the present embodiment shown in FIG. 8A has a linear adhesion section 107 along the extending direction of the bending axis. However, in the present embodiment, the position of the adhesion section 107 is different from that in the first embodiment in that it is closer to the two-dot chain line 112a than in the first embodiment.

Here, the two-dot chain line 112a shown in FIG. 8A is the folding position of the liquid crystal cell 110 and essentially corresponds to the inner end (end section on the inner side) of the bent part 112. The distance between the two-dot chain line 112a and the adhesion section 107 is given as X1. In addition, the distance between the adhesion section 107 and a section of the sealant 106 adjacent to the terminal section 103 is given as X2. At this time, in the present embodiment, the adhesion section 107 is arranged so as to satisfy the relationship X1<X2.

In other words, the adhesive section 107 of the present embodiment is arranged further to the outside than the inner end of the bent part 112 and on inner side of the sealant 106, and the distance between the adhesive section 107 and the inner end of the bent part 112 is smaller than the distance between the adhesive section 107 and the sealant 106.

By arranging the adhesive section 107 with the structure described above, it is possible to effectively improve the strength at the bent part 112 and adhesion between the substrates.

Figure 8B:
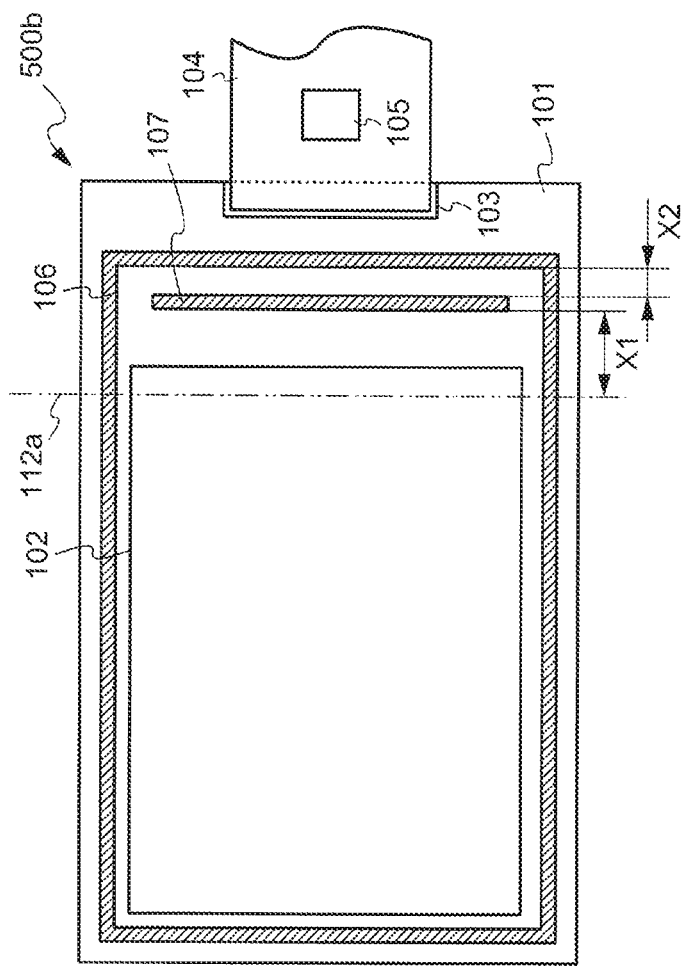
FIG. 8B is a plan view depicting an example of a schematic configuration of a display panel in a fifth embodiment.

However, the structure shown in FIG. 8A is merely one preferred form and the position where the adhesive section 107 can be arranged is not limited. That is, for example, as in the case of the display panel 500b shown in FIG. 8B, a structure in which the adhesive section 107 is arranged so as to satisfy the relationship X1>X2 is not excluded.

Sixth Embodiment

In the sixth embodiment, an example is explained in which a resin material forming the adhesive section 107 is different from that in the first embodiment. Furthermore, in the present embodiment, explanation is provided focusing on the difference in structure with the display panel 100 of the first embodiment, and the same reference numerals are attached to the same structures and an explanation thereof may be omitted.

Figure 9:
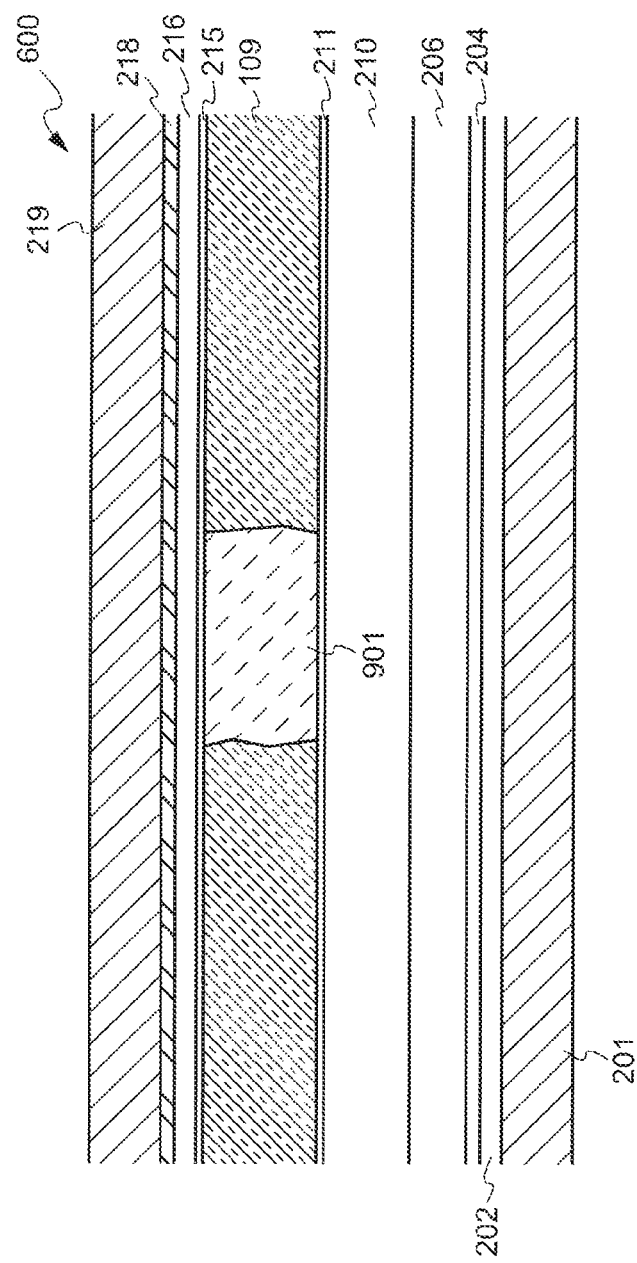
FIG. 9 is a sectional view depicting an example of a schematic configuration in a vicinity of a bent portion of a display panel in a sixth embodiment.

FIG. 9 is a cross-sectional view showing an example of the structure in the vicinity of the bent part 112 of the display panel 600 in the sixth embodiment. In the display panel 600 of the present embodiment, a resin structure obtained by polymerizing monomers dispersed in the liquid crystal layer 109 is used as the adhesive section 901.

The resin structure described above is a structure (polymer) obtained by polymerizing a monomer and is also called a polymer wall. As the monomer, a material excellent in solubility with a liquid crystal is preferably used, and for example, a material having a molecular skeleton similar to a liquid crystal such as a phenyl group and a cyclohexane group or the like is preferred. Specifically, it is possible to use polyethylene, polypropylene, polyolefin, acrylic, methacrylic, epoxy, urethane, polystyrene, polyvinyl alcohol, fluororesin, or a copolymer of these.

As a specific formation method, the monomer may be locally polymerized to form a resin structure for example, by dispersing the monomer described above in advance in the liquid crystal layer 109, and irradiating a part of the liquid crystal layer 109 with ultraviolet light (typically light having a center wavelength of 365 nm). In this case, the resin structure can be said to be a polymer (polymer) of a monomer dispersed in advance in the liquid crystal layer 109. It can also be said that this polymer has a three-dimensional crosslinked structure.

Furthermore, various methods can be adopted as a method of irradiating a part of the liquid crystal layer 109 with ultraviolet light. Here, FIG. 10A and FIG. 10B are cross-sectional views showing an example of a method of manufacturing the display panel 600 in the sixth embodiment.

For example, as is shown in FIG. 10A, a light shielding member 904 having an opening section 903 is arranged above the region where the adhesive section 901 is to be formed as is shown in FIG. 9, and it is possible to locally irradiate the ultraviolet light 905 through the opening section 903. In this case, the monomer 906 dispersed in advance in the liquid crystal layer 109 is polymerized in the region irradiated with ultraviolet light through the opening section 903.

At this time, polymerization of the monomer 906 starts from the alignment films of both the array substrate 101 and the opposing substrate 108. Therefore, as shown in FIG. 10A, a polymer 901a adhered to an alignment film 211 and a polymer 901b adhered to an alignment film 215 are respectively formed. These polymers 901a and 901 b are finally integrated near the center of the liquid crystal layer 109 to form the adhesive section 901 shown in FIG. 9.

Figure 10B:
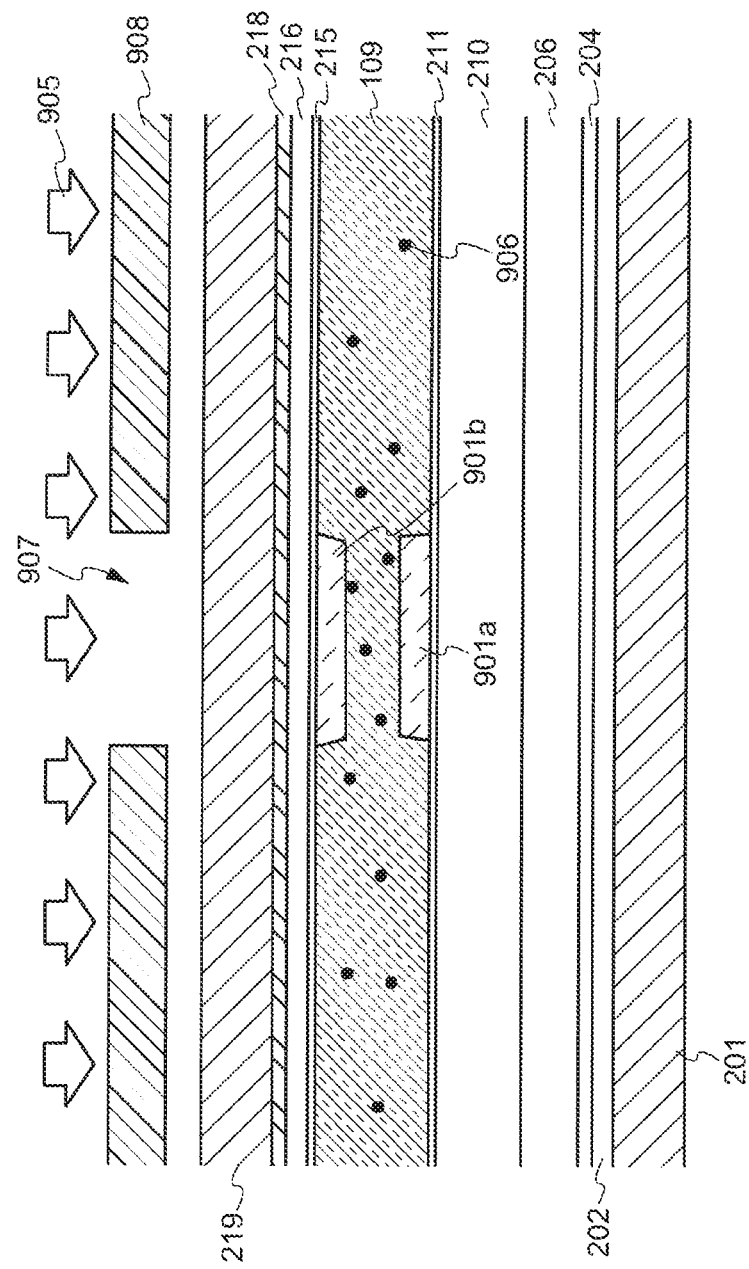
FIG. 10B is a sectional view depicting the example of a manufacturing process of the display panel in the sixth embodiment.

In addition, as shown in FIG. 10B, a light shielding mask 908 having an opening section 907 may be arranged on the rear surface side of a resin substrate 219, and ultraviolet light may be locally irradiated through the opening section 907. In this case, the monomer 906 dispersed in advance in the liquid crystal layer 109 is polymerized in the region irradiated with the ultraviolet light through the opening section 907. Also in this case, as explained using FIG. 10A, the monomer 906 starts polymerization on both sides of the array substrate 101 and the opposite substrate 108 and polymers 901a and 901b are formed.

As described above, according to the present embodiment, after the liquid crystal layer 109 is sealed between the array substrate 101 and the opposing substrate 108, it is possible to arrange the adhesive section 901 formed from a resin structure. Therefore, compared with the first embodiment, it is possible to omit photolithography for forming the adhesive section.

Furthermore, at the point when the liquid crystal material is sealed inside the sealant 106, the adhesive section 901 is not present inside the sealant 106. Therefore, compared with the first embodiment, when the liquid crystal material is dripped onto the array substrate 101, it is possible to make spreading of the liquid crystal material on the array substrate 101 easier.

Seventh Embodiment

In the seventh embodiment, an example is explained in which the position at which the adhesion section 107 is arranged is set to a position different from that in the first embodiment. Furthermore, in the present embodiment, explanation is provided focusing on the difference in structure with the display panel 100 of the first embodiment, and the same reference numerals are attached to the same structures and an explanation thereof may be omitted.

Figure 11A:
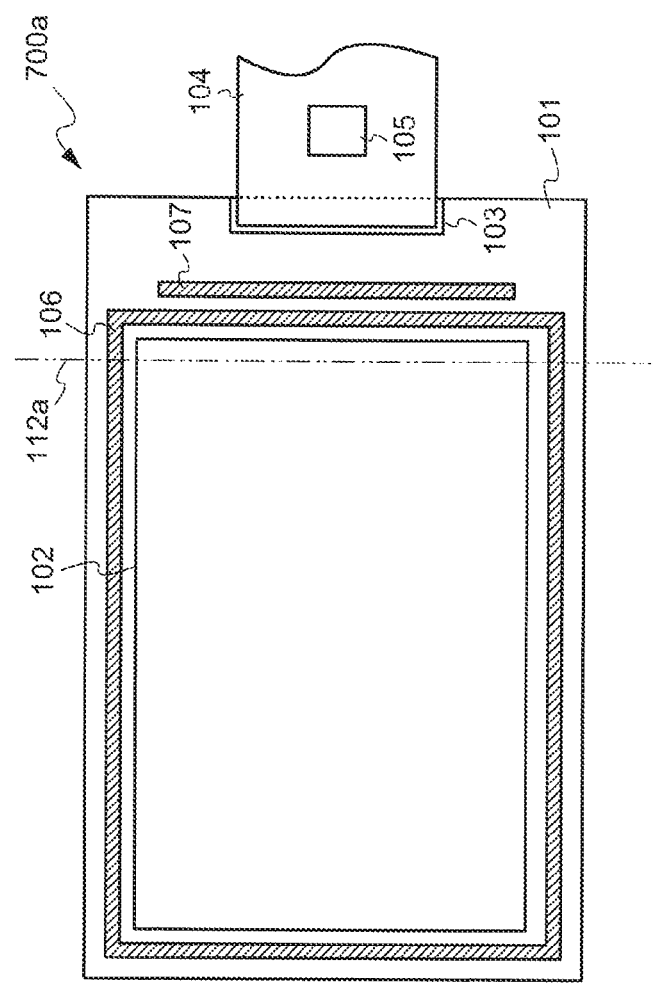
FIG. 11A is a plan view depicting an example of a schematic configuration of a display panel in a seventh embodiment.
Figure 11B:
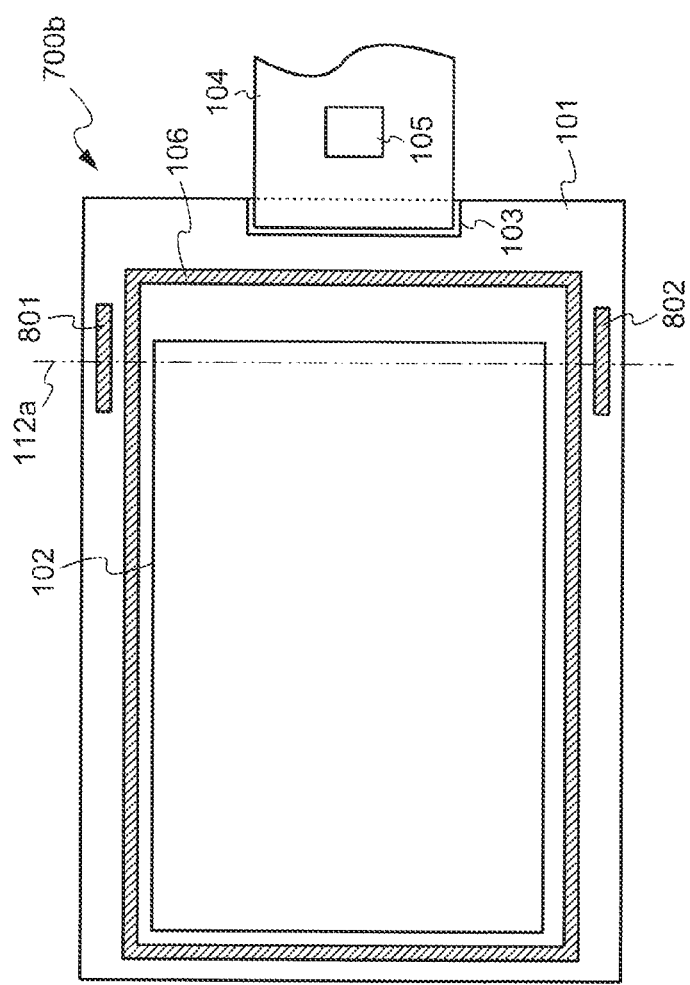
FIG. 11B is a plan view depicting an example of a schematic configuration of a display panel in the seventh embodiment.

FIG. 11A is a planar view diagram showing an example of a schematic structure of the display panel 700a in the seventh embodiment. FIG. 11B is a planar view diagram showing an example of a schematic structure of the display panel 700b in the seventh embodiment.

Similar to the first embodiment, the display panel 700a of the present embodiment shown in FIG. 11A has a linear adhesive section 107 along the extending direction of the bending axis. However, the present embodiment is different from the first embodiment in that the position of the adhesive section 107 is on the outer side of the sealant 106. In addition, the display panel 700b of the present embodiment shown in FIG. 11B includes linear adhesive sections 801 and 802 in a direction orthogonal to the extending direction of the bending axis. Also in this case, the adhesive sections 801 and 802 are arranged on the outer side of the sealant 106.

In the display panel 700a of the present embodiment, the section of the sealant 106 adjacent to the terminal section 103 is positioned in the vicinity of the two-dot chain line 112a which is a folding position. As a result, even when the adhesive section 107 is arranged on the outer side of the sealant 106, it is possible to arrange the adhesive section 107 near the bent part 112. In addition, in the case of the display panel 700b of the present embodiment, it is possible to arrange the adhesive sections 801 and 802 in the vicinity of the bent part 112 regardless of the position of the sealant 106.

As described above, in the display panels 700a and 700b of the present embodiment, when the liquid crystal material is dripped using an ODF method, since the adhesion section 107 is not present on the inner side of the sealant 106, spreading of the liquid crystal material is not obstructed.

Therefore, according to the present embodiment, in addition to the effects of the first embodiment described above, when a liquid crystal material is dripped onto the array substrate 101, the effect of being easy to spread the liquid crystal material on the array substrate 101 is exhibited.

Eighth Embodiment

In the display panel 100 of the first embodiment, the example is described in which bending is performed along one side of the display section 102. In an eighth embodiment, an example is described in which the display panel is bent along two different sides of the display section. Description is made by focusing on a difference in configuration from the display panel 100 of the first embodiment, and the same structure is provided with the same reference character and may not be described.

Figure 12:
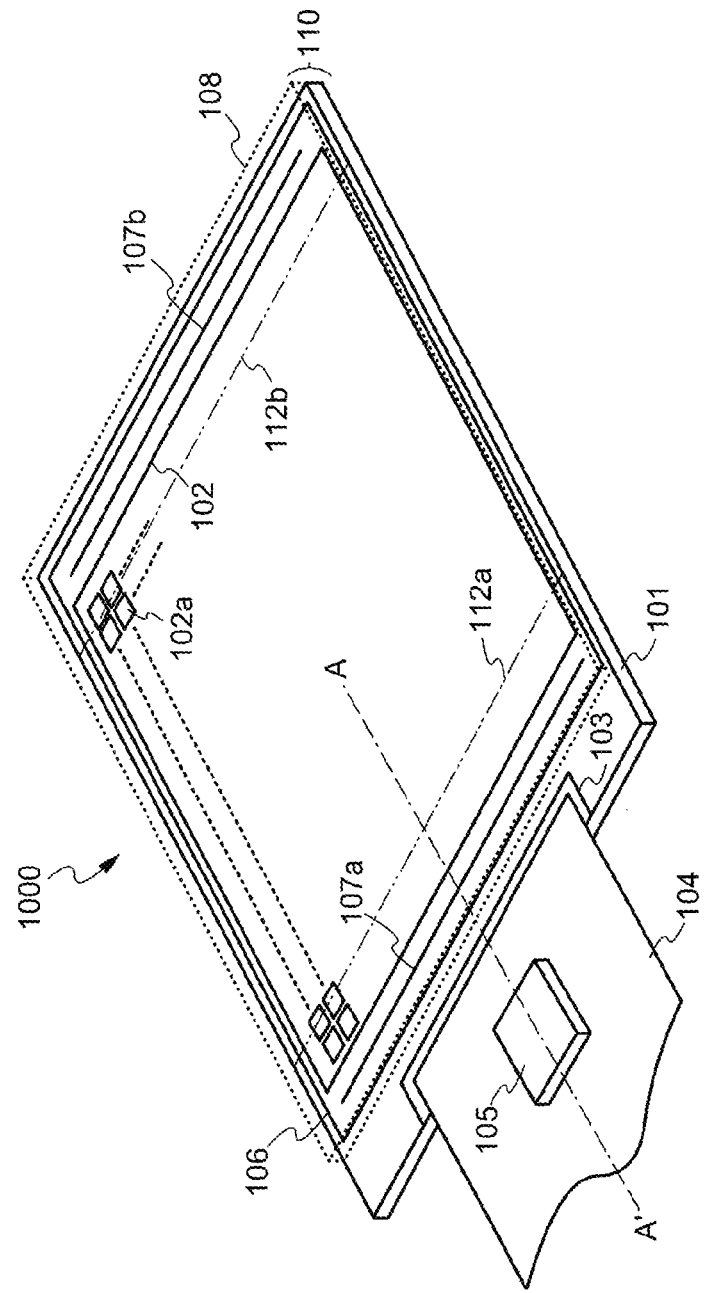
FIG. 12 is a perspective view depicting an example of a schematic configuration of a display panel in an eighth embodiment.

FIG. 12 is a perspective view depicting a schematic configuration of a display panel 1000 in the eighth embodiment. In the display panel 1000 of the present embodiment, the configuration is such that the liquid-crystal cell 110 is bent not only along the two-dot-chain line 112a but also along a two-dot-chain line 112b. Also in this case, the two-dot-chain line 112b is inside the sealant 106 (specifically, inside the display section 102), and the curved part formed outside the two-dot-chain line 112b is thus formed inside the sealant 106.

In addition, in the display panel 1000 according to the present embodiment, the linear adhesive section 107a is arranged along the two-dot chain line 112a and the linear adhesive section 107b is arranged along the two-dot chain line 112b. That is, the adhesion section 107a and the adhesion section 107b are both arranged in the vicinity of the bent part.

In the display panel 1000 depicted in FIG. 12, no bezel portion is present on two sides of the displayable region. Thus, it is possible to provide a thin display panel with a further less bezel portion than the display panel 100 of the first embodiment.

Figure 13:
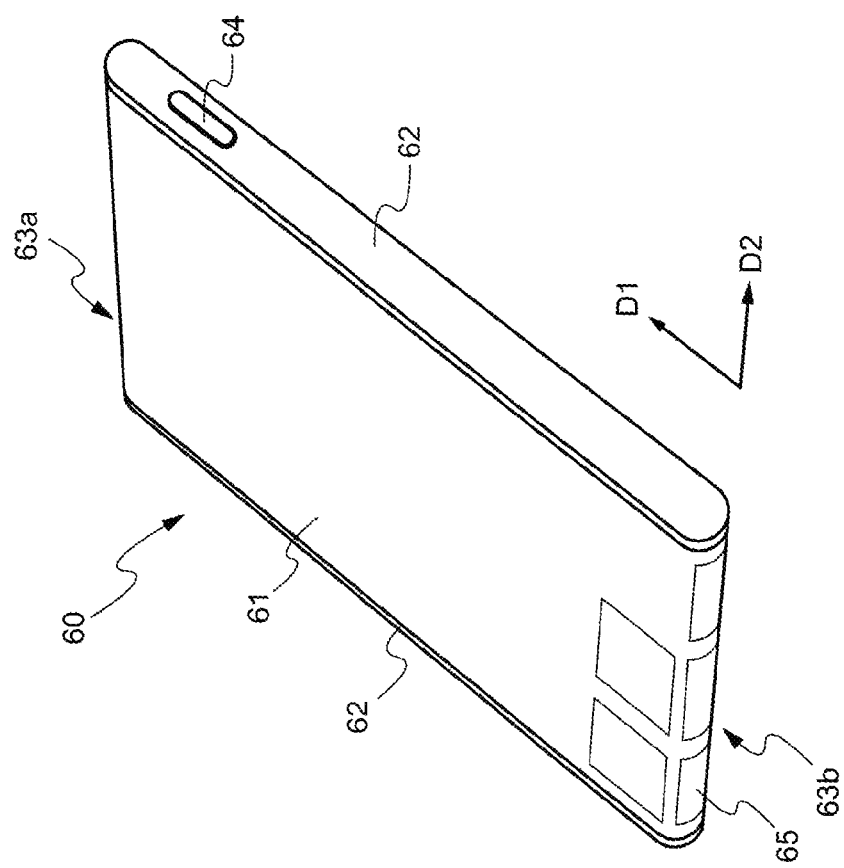
FIG. 13 is a perspective view depicting an example of a schematic configuration of a display device having the display panel of the eighth embodiment incorporated therein.

FIG. 13 is perspective view depicting example of display device 60 having incorporated therein the display panel 1000 of the present embodiment. Specifically, as the display device 60, portable telephones (smartphones) are illustrated. However, the display device 60 is not limited to portable telephone but can be applied to any information terminal having a display screen, such as a tablet PC.

The display device 60 depicted in FIG. 13 includes a display screen 61 and the frame section 62. The display screen 61 is a screen for displaying video by using the display section 102 depicted in FIG. 12. While the display screen 61 is flat in the present embodiment, ends 63a and 64a of the display screen 61 are bowed. The frame section 62 functions as a housing of the display device 60. The frame section 62 is also called a bezel. the frame section 62 may be provided with an input section 64 configured of hardware such as a power supply button.

As depicted in FIG. 12, the display panel 1000 of the present embodiment is bent to the back surface side along the two-dot-chain line 112a and the two-dot-chain line 112b. Therefore, as depicted in FIG. 13, when the display device 60 is viewed in a planar view, the display screen 61 in the D1 direction is curved at the ends 63a and 63b. Thus, the frame section 62 is not visually recognized by the observer at the ends 63b and 64b of the display screen 61 in the D1 direction in a planar view. That is, the display screen 61 extends to a virtual end (an end visually recognizable by the observer in a planar view) in the D1 direction.

Thus, since the display screen 61 is bowed at the ends 63*a* and 63*b*, an object 65 configuring a user interface such as an icon can be displayed also at the bowed portion. That is, in the display device 60, by bending two sides of the display section 102 of the display panel 1000 facing each other, the ends 63*a* and 63*b* can be effectively utilized as the display screen 61.

Furthermore, in the display device 60 of the present embodiment, a wiring layout is considered so that a portion of the frame section 62 positioned on the same plane as the display screen 61 can be narrowed as much as possible. This can allow the display section 102 depicted in FIG. 12 to be fully and effectively utilized in both of the D1 and D2 directions as a display screen of the display device 60.

Figure 14:
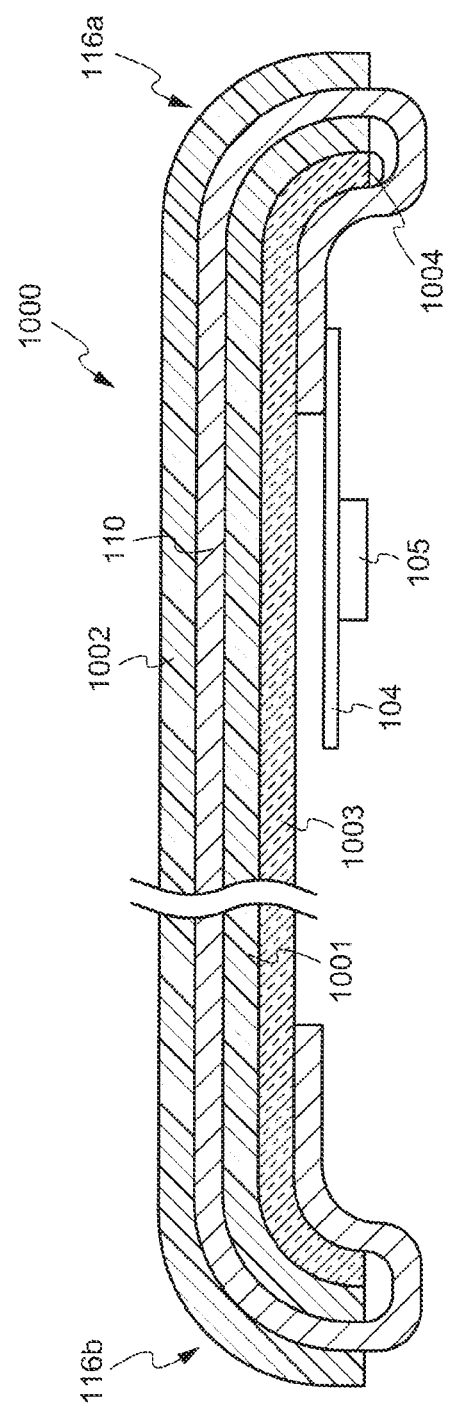
FIG. 14 is a sectional view depicting an example of a schematic configuration of a display panel in the eighth embodiment.

Here, FIG. 14 depicts an example of a sectional view of the display panel 1000 when the display device 60 of the present embodiment is cut along a D1 direction. As depicted in FIG. 14, in the display panel 1000, flexible polarizing members 1001 and 1002 are arranged so as to interpose the liquid-crystal cell 110. Also, on the back surface side of the flexible polarizing member 1001, a light-guiding member with flexibility (hereinafter referred to as a "flexible light-guiding member") 1003 is arranged. At an end of the flexible light-guiding member 1003, a light source 1004 is arranged. As the light source 1004, for example, an LED light source can be used.

In the present embodiment, a polarizing member with a thickness reduced to the extent of having flexibility is used as the flexible polarizing members 1001 and 1002. For example, by using a polarizing member with a thickness equal to or less than 70 μm (preferable equal to or less than 60 μm and, more preferably, equal to or less than 50 μm), the flexible polarizing members 1001 and 1002 can be extended to the curved parts 116*a* and 116*b*.

The flexible polarizing members 1001 and 1002 can be replaced with polarizing members capable of coating formation (also referred to as coating-type polarizing members). Also, as a method of forming the coating-type polarizing members 1001 and 1002, a known technique can be used. For example, Direct Blue 202, Direct Orange 39, and Direct Red 81 are mixed at a ratio of 7:1:2 into a photosensitive resin containing an epoxy acrylate derivative with a fluorene skeleton and used for coating the back surface of the array substrate 101 or the back surface of the counter substrate 108, and then photolithography is used to form the coating-type polarizing members 1001 and 1002. Also, for example, a coating-type polarizing member described in Japanese Unexamined Patent Application Publication No. 2006-91393 or 2008-89966 can be used.

As described above, in the display panel 1000 of the present embodiment, the polarizing member and the light-guiding member are arranged also at the curved parts 116*a* and 116*b*. This allows the curved parts 116*a* and 116*b* to be used as part of the display section 102.

While the example is described in the present embodiment in which the liquid-crystal cell 110 is bent along two sides of the display section 102 and the ends 63*a* and 63*b* of the display screen 61 in the D1 direction are bowed. However, the present embodiment is not limited to this. For example, two sides can be bowed not only in the D1 direction but also in the D2 direction to make a display screen with ends of all of four sides being bowed. In this case, in a planar view, a display device without a frame portion can be achieved.

Ninth Embodiment

In a ninth embodiment, an example is described in which the display panel is bent along two sides different from those of the eighth embodiment. Description is made by focusing on a difference in configuration from the display device 60 and the display panel 1000 of the eighth embodiment, and the same structure is provided with the same reference character and may not be described.

Figure 15:
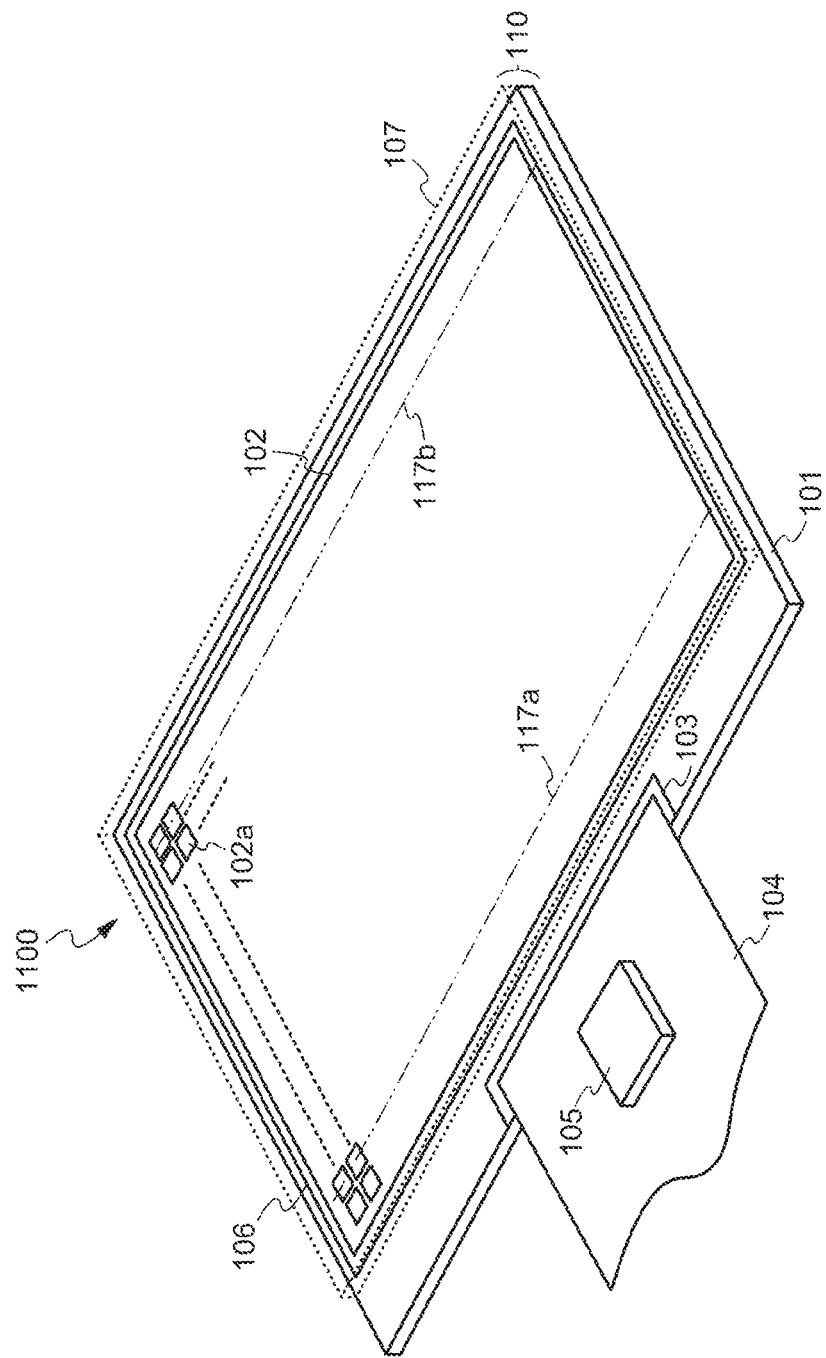
FIG. 15 is a perspective view depicting an example of a schematic configuration of a display panel in a ninth embodiment.

FIG. 15 is perspective view depicting a schematic configuration of a display panel 1100 in the ninth embodiment. In the eighth embodiment depicted in FIG. 12, the terminal section 103 is provided on a short side of the display panel 1000 and bending is performed along the short side. By contrast, in the present embodiment depicted in FIG. 15, the terminal section 103 is provided on a long side of the display panel 1100 and bending is performed along the long side. That is, the display panel 1100 of the present embodiment is configured to be bent along two-dot-chain lines 117*a* and 117*b* along the long sides of the liquid-crystal cell 110.

As with the eighth embodiment, the two-dot-chain lines 117*a* and 117*b* are inside the sealant 106 (specifically, inside the display section 102). Thus, the curved part corresponding to a bent portion is formed inside the sealant 106.

Figure 16:
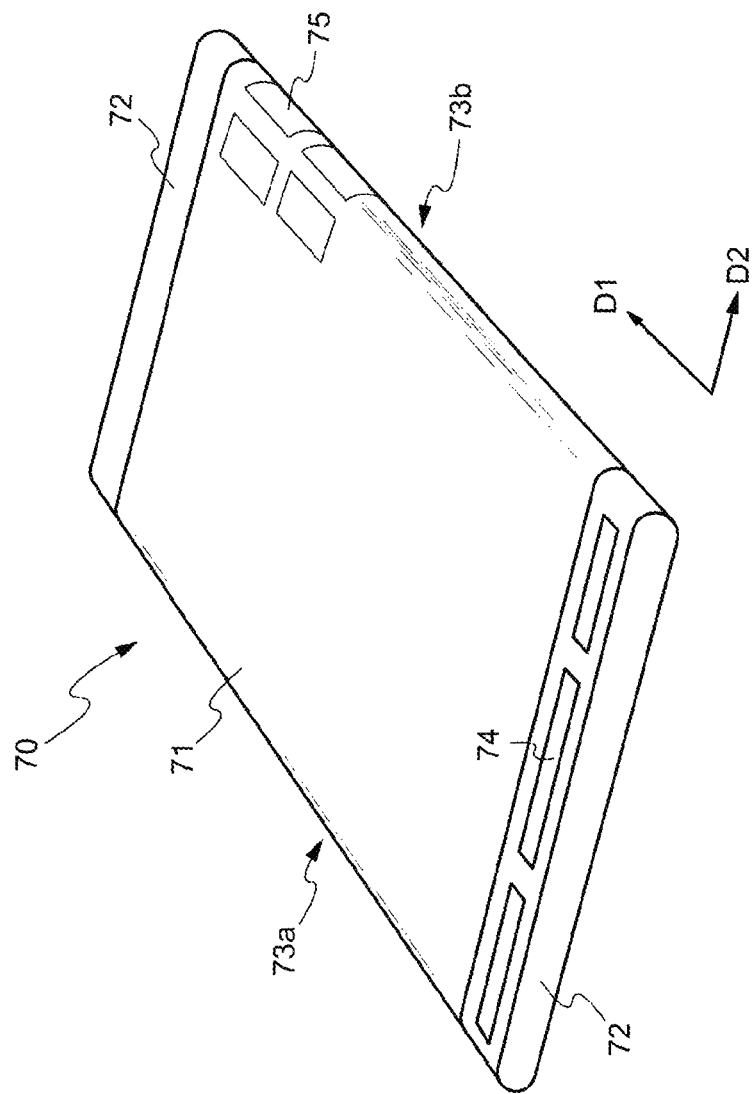
FIG. 16 is a perspective view depicting an example of a schematic configuration of a display device having the display panel of the ninth embodiment incorporated therein.

FIG. 16 is a perspective view depicting an example of the display device 70 having the display panel 1100 of the present embodiment incorporated therein. Specifically, a portable telephone (smartphone) is illustrated as the display device 70. However, the display device 70 is not limited to a portable telephone but can be applied to any information terminal having a display screen, such as a tablet PC.

As with the display device 60 depicted in FIG. 13, the display device 70 includes a display screen 71, a frame section 72, and bowed ends 73*a* and 73*b*. In the present embodiment, when viewed in a planar view, the ends 73*a* and 73*b* of the display screen 71 in the D2 direction are bowed. The frame section 72 is provided with an input section 74 configured of hardware such as a power supply button. Also, at the ends 73*a* and 73*b*, an object 75 configuring a user interface such as an icon can be displayed.

Also in the display panel 1100 of the present embodiment, as with the eighth embodiment, a flexible polarizing member and a flexible light-guiding member are used. That is, a flexible polarizing member and a flexible light-guiding member can be arranged also at a curved part outside the two-dot-chain lines 117*a* and 117*b*, and the ends 73*a* and 73*b* of the display screen 71 can thus be used as part of the display screen 71. In particular, in the present embodiment, the configuration is such that the long sides of the display panel 1100 are bowed. Thus, the object 75 can be displayed at a position naturally touched by a finger when the observer holds the display panel 1100 by hand.

In the present embodiment, the example is described in which the liquid-crystal cell 110 is bent along two sides of the display section 102 to bow the ends 73*a* and 73*b* of the display screen 71 in the D2 direction. However, the present embodiment is not limited to this. For example, two sides can be bowed not only in the D2 direction but also in the D1 direction to make a display screen with ends of all of four sides being bowed. In this case, in a planar view, a display device without a frame portion can be achieved.

Tenth Embodiment

In the tenth embodiment, an example is described in which the entire display screen 71 of the display device 70 in the ninth embodiment is bowed. Description is made by focusing on a difference in configuration from the display device 70 and the display panel 1100 of the ninth embodiment, and the same structure is provided with the same reference character and may not be described.

Figure 17:
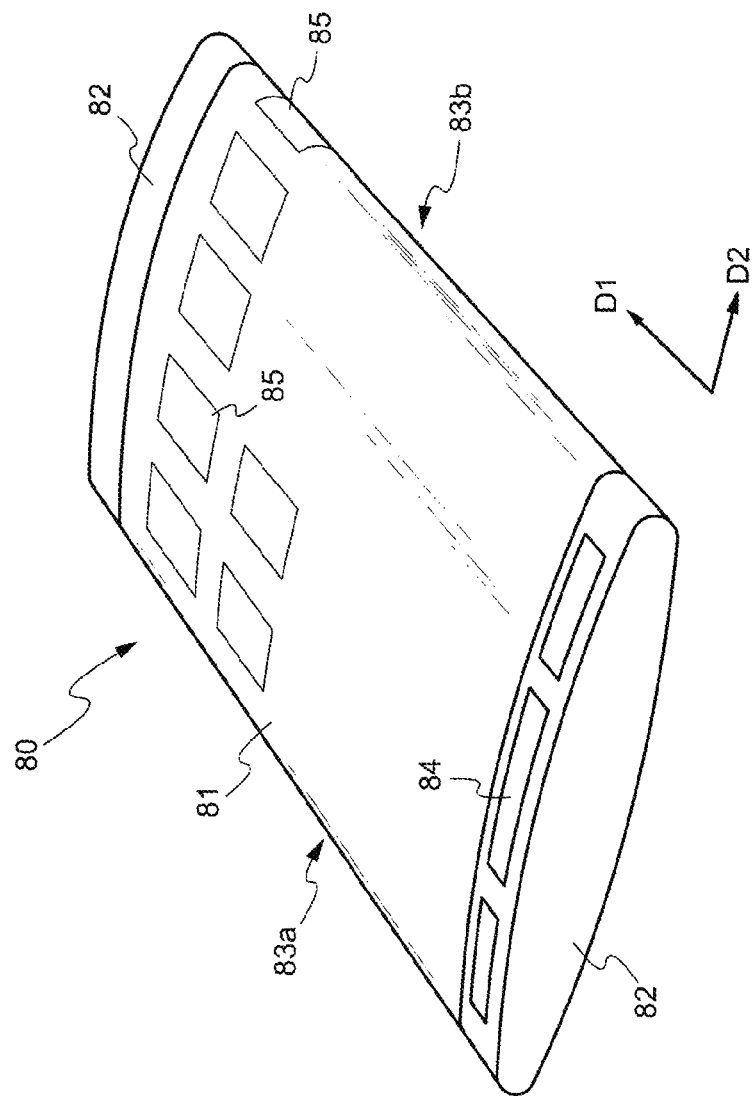
FIG. 17 is a perspective view depicting an example of a schematic configuration of a display device having the display panel of the tenth embodiment incorporated therein.

FIG. 17 is a perspective view depicting an example of a display device 80 having a display panel 1200 of the tenth embodiment incorporated therein. While a portable telephone (smartphone) is illustrated as the display device 80 also in the present embodiment, the present embodiment is not limited to this.

As with the display device 70 depicted in FIG. 16, the display device 80 includes a display screen 81, a frame section 82, and bowed ends 83a and 83b. In the present embodiment, the entire display screen 81 is mildly bowed in the D2 direction, and the ends 83a and 83b are bowed at a radius of curvature smaller than that near the center of the display screen 81. Thus, the display device 80 is in an elliptic columnar shape.

Also in the present embodiment, as with the ninth embodiment, the frame section 82 is provided with an input section 84 configured of hardware such as a power supply button. Also on the display screen 81 (including the ends 83a and 83b), an object 85 configuring a user interface such as an icon can be displayed.

Figure 18:
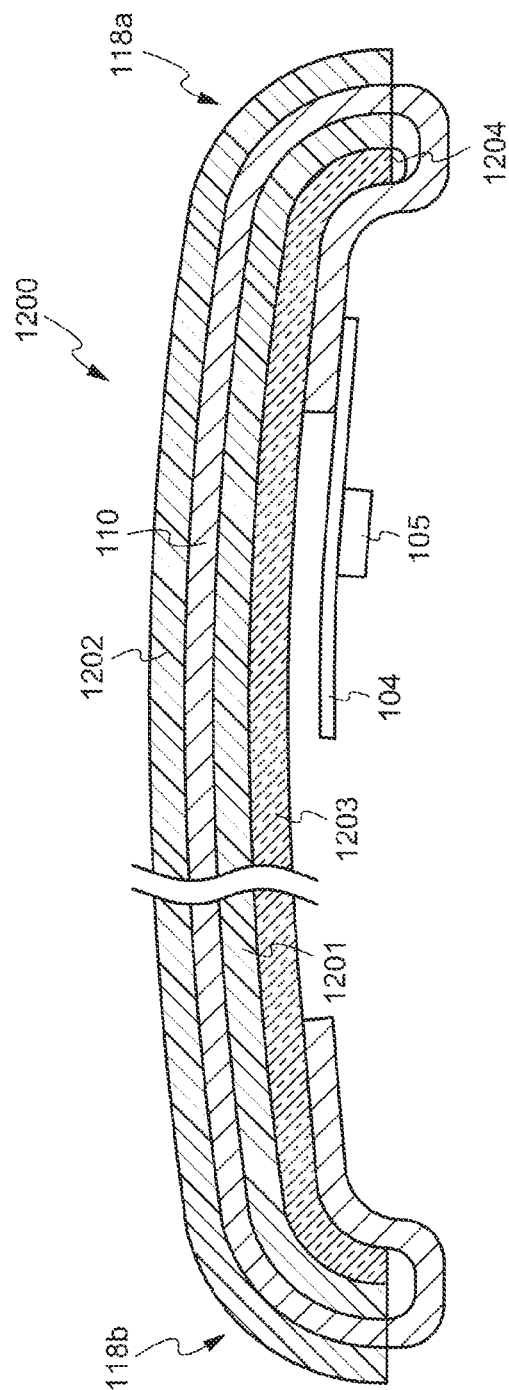
FIG. 18 is a sectional view depicting an example of a schematic configuration of a display panel in the tenth embodiment.

FIG. 18 depicts an example of a sectional view of the display panel 1200 when the display device 80 of the present embodiment is cut along a D2 direction. As depicted in FIG. 18, in the display panel 1200, flexible polarizing members 1201 and 1202 are arranged so as to interpose the liquid-crystal cell 110. Also, a flexible light-guiding member 1203 is arranged on a back surface side of the flexible polarizing member 1201. At an end of the flexible light-guiding member 1203, a light source 1204 is arranged. As the light source 1204, for example, an LED light source can be used.

In the present embodiment, as the flexible polarizing members 1201 and 1202, a polarizing member with a thickness reduced to the extent of having flexibility is used. As depicted in FIG. 18, the flexible polarizing members 1201 and 1202 are each mildly bowed at a portion near the center to bow curved parts 118a and 118b at a radius of curvature smaller than that near the center. Also, the flexible light-guiding member 1203 is bowed to have a shape similar to those of the flexible polarizing members 1201 and 1202.

As described above, in the display panel 1200 of the present embodiment, not only the curved parts 118a and 118b but also the polarizing members and the light-guiding members arranged near the center of the display section 102 are bowed. Thus, more stereoscopic video display can be provided to the observer.

In the present embodiment, the example is described in which the ends 83a and 83b of the display screen 81 in the D2 direction are bowed. However, the present embodiment is not limited to this. For example, two sides can be bowed not only in the D2 direction but also in the D1 direction to make a display screen with a portion near the center and ends of all of four sides being bowed. In this case, in a planar view, a display device without a frame portion can be achieved.

In each of the embodiments described above, description is made to a display panel by way of example. However, a display device having the display panel in each embodiment incorporated therein can be included in the scope of the present invention. Here, the display device refers to a general device using the display panel as a display medium such as a portable information terminal.

The embodiments described above as embodiments of the present invention can be implemented as being combined as appropriate as long as combinations are not contradictory to one another. Also, addition, deletion, or design change of a component or addition, omission, or change in condition of a step made as appropriate by a person skilled in the art based on the display panel of each embodiment is included in the scope of the present invention as long as they have the gist of the present invention.

Even operations and effects that are different from those brought by the modes of each of the above-described embodiments but are evident from the description of the specification or can be easily predicted by a person skilled in the art are construed as those naturally brought by the present invention.

What is claimed is:

1. A display device comprising:
    a first substrate having flexibility and having a plurality of signal lines and a plurality of thin film transistors;
    a second substrate having flexibility and having a color filter;
    a sealant formed along an outer periphery of the second substrate and adhering the first substrate and the second substrate;
    a liquid crystal layer sealed by the first substrate, the second substrate and the sealant;
    an adhesion section for adhering the first substrate and the second substrate arranged on an inner side or outer side of the sealant;
    a first polarizing plate disposed overlapping the first substrate;
    a second polarizing plate disposed overlapping the second substrate; and
    a backlight disposed along the first substrate and having a first surface on the first substrate side, a second surface serving as a side surface and a third surface serving as a back surface of the first surface,
    wherein
    the first substrate and the second substrate have a display portion, a bending portion and a back-surface portion,
    the display portion opposes the first surface of the backlight,
    the bending portion opposes the second surface of the backlight,
    the back-surface portion opposes the third surface of the backlight,
    the adhesion section is arranged in the bending portion, and
    the first polarizing plate and the second polarizing plate are in contact with only the display portion and are not in contact with the bending portion and the back-surface portion.

2. The display device according to claim 1, wherein the adhesion section is a resin structured body.

3. The display device according to claim 1, wherein the adhesion section is formed from a material having a higher moisture permeability or oxygen permeability compared to the sealant.

4. The display device according to claim 1, wherein the adhesion section extends along an extension direction of a curved axis of the bending portion.

5. The display device according to claim 1, wherein a plurality of adhesion sections is arranged in an extension direction of a curved axis of the bending portion or in a direction intersecting the extension direction.

6. The display device according to claim 1, wherein a length of the adhesion section in an extension direction of a curved axis of the bending portion is shorter than a length of the sealant in the extension direction.

7. The display device according to claim 1, wherein the adhesion section is formed from a resin having thermosetting properties.

8. The display device according to claim 1, wherein the adhesion section is arranged further to the outer side of than an inner end of the bending portion and on an inner side of the sealant, and a distance between the adhesion section and the inner end of the bending portion is shorter than a distance between the adhesion section and the sealant.

9. The display device according to claim 1, wherein bending rigidity in the bending portion is lower than bending rigidity further to the inner side than the bending portion.

10. The display device according to claim 1, wherein the sealant is formed across the display portion, the bending portion and the back-surface portion.

11. The display device according to claim 1, wherein a terminal area is formed between the end of the first substrate and the sealant in the back-surface portion.

* * * * *